(12) United States Patent
Ikuta et al.

(10) Patent No.: US 7,960,077 B2
(45) Date of Patent: Jun. 14, 2011

(54) REFLECTIVE-TYPE MASK BLANK FOR EUV LITHOGRAPHY

(75) Inventors: Yoshiaki Ikuta, Guilderland, NY (US);
Toshiyuki Uno, Guilderland, NY (US);
Ken Ebihara, Matsudo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 12/694,860

(22) Filed: Jan. 27, 2010

(65) Prior Publication Data

US 2010/0167187 A1 Jul. 1, 2010

Related U.S. Application Data

(63) Continuation of application No. 11/330,205, filed on Jan. 12, 2006, now Pat. No. 7,678,511.

(51) Int. Cl.
*G03F 1/00* (2006.01)
(52) U.S. Cl. .......................................................... 430/5
(58) Field of Classification Search .............. 430/5, 322, 430/323, 324; 378/35; 428/428, 430
See application file for complete search history.

(56) References Cited

U.S. PATENT DOCUMENTS

| | | | |
|---|---|---|---|
| 6,098,408 A | 8/2000 | Levinson et al. | |
| 6,749,973 B2 | 6/2004 | Shoki et al. | |
| 6,806,007 B1 | 10/2004 | Abdo et al. | |
| 6,984,475 B1 | 1/2006 | Levinson et al. | |
| 2002/0076625 A1 | 6/2002 | Shoki et al. | |
| 2004/0063004 A1 | 4/2004 | Alkemper et al. | |
| 2004/0067420 A1 | 4/2004 | Ota | |
| 2004/0106051 A1 | 6/2004 | Kamm | |
| 2005/0069787 A1 | 3/2005 | Kobayashi et al. | |
| 2005/0238922 A1 | 10/2005 | Kinoshita et al. | |
| 2006/0007433 A1 | 1/2006 | Ikuta et al. | |

FOREIGN PATENT DOCUMENTS

| | | |
|---|---|---|
| EP | 1 387 189 A2 | 2/2004 |
| EP | 1 387 189 A3 | 2/2004 |
| JP | 2000-208594 | 7/2000 |
| JP | 2002-319542 | 10/2002 |
| JP | 2005-210093 | 8/2005 |
| WO | 00/75727 | 12/2000 |

OTHER PUBLICATIONS

J. Ruan, J. Hartley: "Electron beam pattern generator sensitivity to target potentials", Proceedings of the SPIE, Conference Paper, vol. 5992, Nov. 8, 2005, pp. 1385-1395, XP002428874.
Extended European Search Report issued Dec. 29, 2010, in Patent Application No. 10014669.5.

*Primary Examiner* — Stephen Rosasco
(74) *Attorney, Agent, or Firm* — Oblon, Spivak, McClelland, Maier & Neustadt, L.L.P.

(57) ABSTRACT

A reflective mask blank for EUV lithography including a substrate having a front surface and a rear surface, a reflective layer formed over the front surface of the substrate, an absorbing layer formed over the reflective layer, and a chucking layer formed on the rear surface of the substrate and positioned to chuck the substrate to an electrostatic chuck. The substrate has a non-conducting portion which eliminates electrical conduction between the reflective layer and the chucking layer and electrical conduction between the absorbing layer and the chucking layer, and the non-conducting portion is formed by forming a portion of the substrate covered with one or more covering members and preventing formation of the reflective layer and the absorbing layer.

24 Claims, 11 Drawing Sheets

PRIOR ART
FIG. 6a
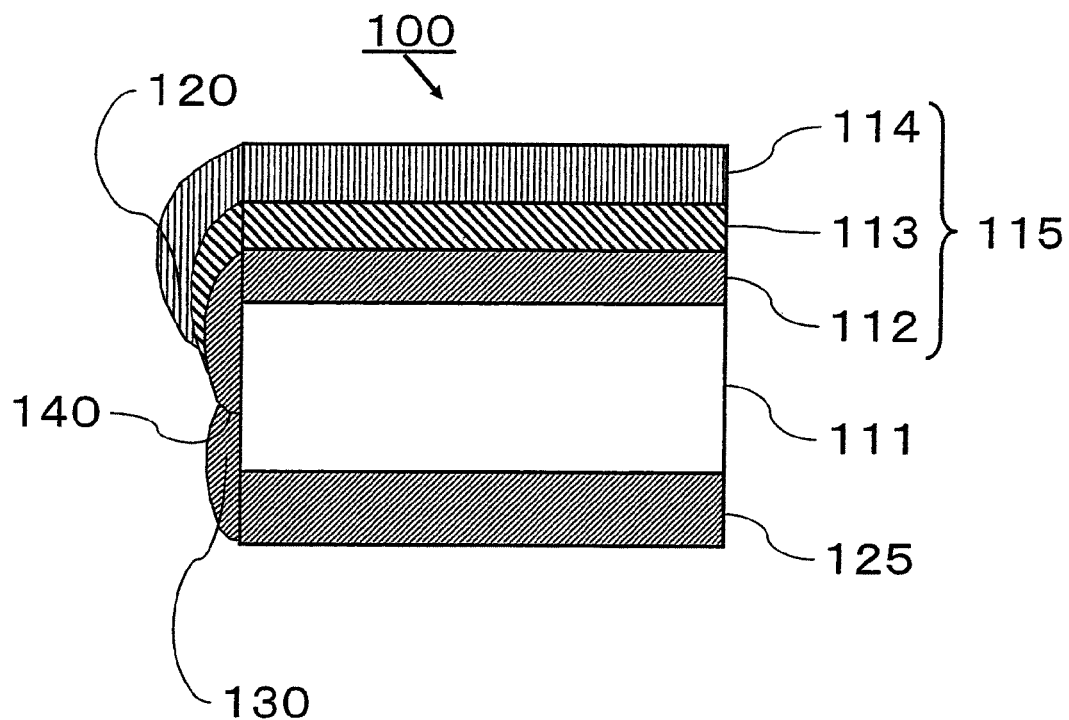
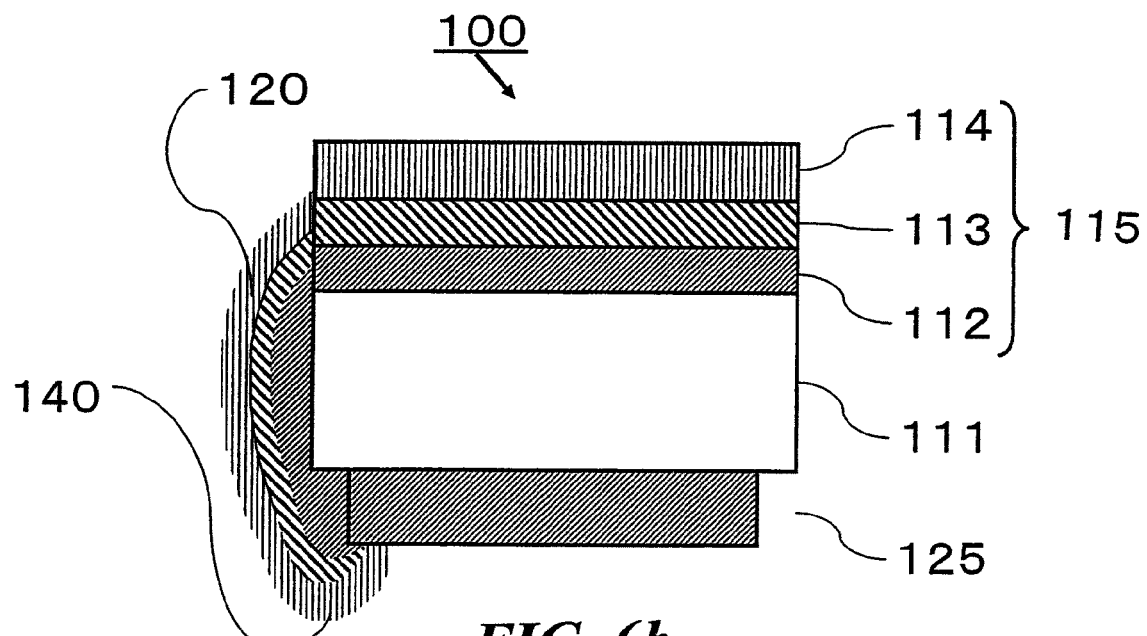
FIG. 6b
PRIOR ART

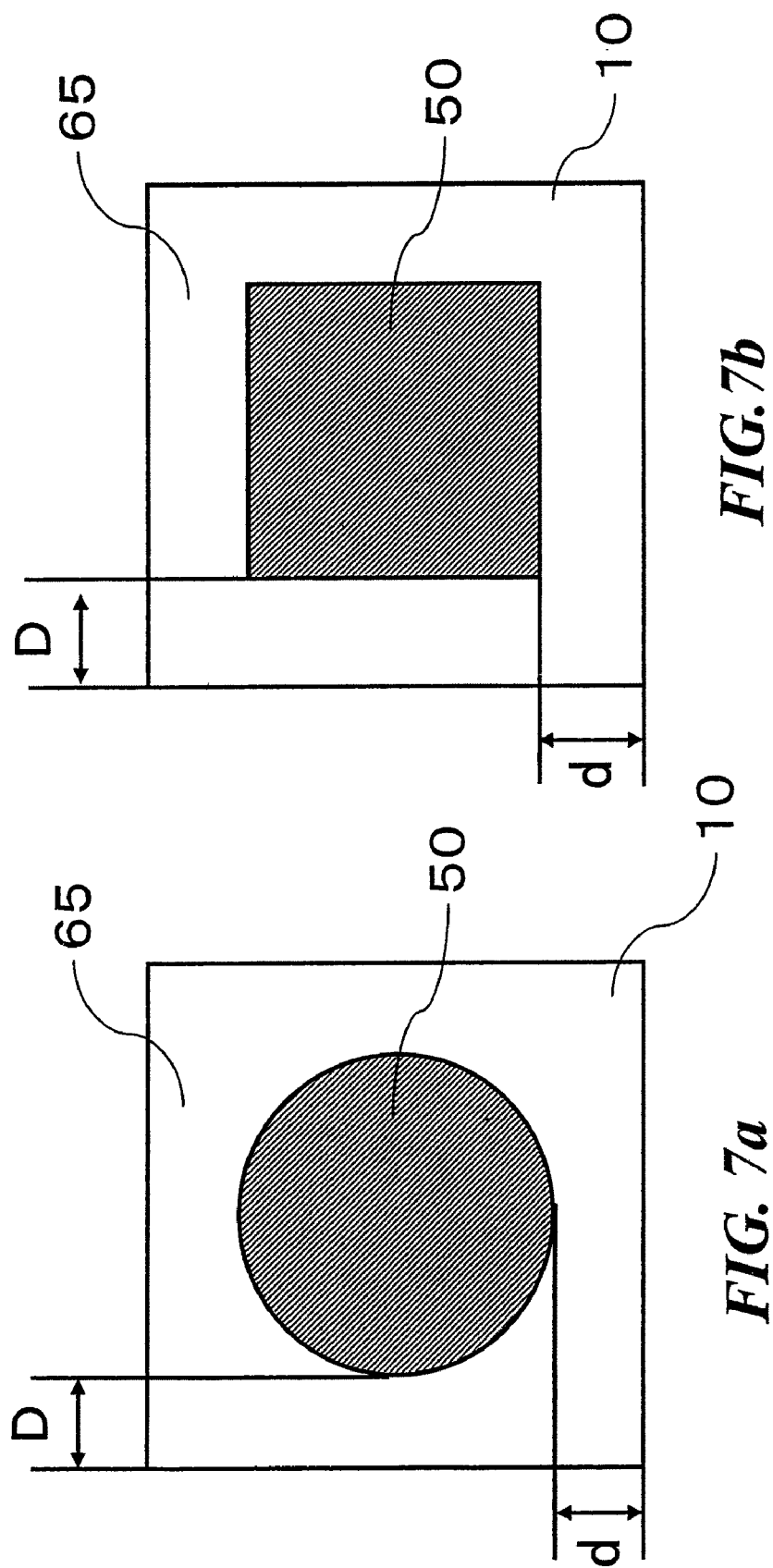

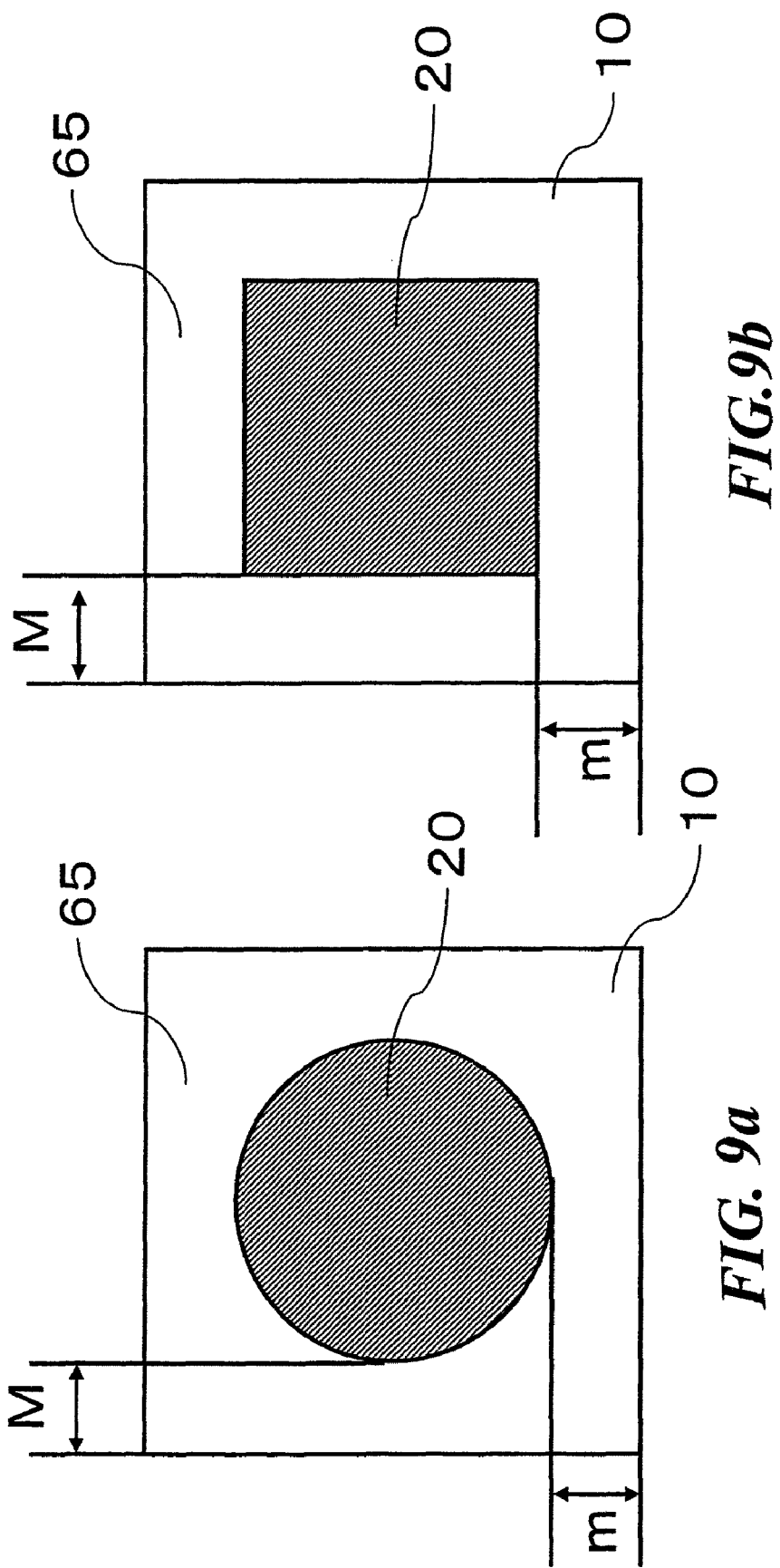

REFLECTIVE-TYPE MASK BLANK FOR EUV LITHOGRAPHY

CROSS-REFERENCE TO RELATED APPLICATIONS

This application is a continuation of and claims benefit of priority from U.S. application Ser. No. 11/330,205, filed Jan. 12, 2006, the entire contents of which are hereby incorporated by reference.

BACKGROUND OF THE INVENTION

1. Field of the Invention

The present invention relates to a reflective mask blank for EUV (Extreme Ultra Violet) lithography (hereinbelow, referred to as "EUV mask blank" in this Description), a reflective mask for EUV (hereinbelow, referred to as "EUV mask" in this Description) and a substrate with a reflective layer, applied thereto, which are used in semiconductor manufacturing or the like.

2. Discussion of Background

In the semiconductor industry, a photolithography method using visible light or ultraviolet light has been employed as a technique for writing, on a Si substrate or the like, a fine pattern, which is required for writing an integrated circuit comprising such a fine pattern. However, the conventional exposure techniques using light exposure have been close to the limit while semiconductor devices have had finer patterns at an accelerated pace. In the case of light exposure, it is said that the resolution limit is about ½ of exposure wavelength, and that even if an immersion method is employed, the resolution limit is about ¼ of an exposure wavelength. Even if an immersion method using an ArF laser (193 nm) is employed, it is estimated that the resolution limit is about 45 nm. From this point of view, EUV lithography, which is an exposure technique using EUV light having a short wavelength than ArF lasers, has considered as being promising as an exposure technique for 45 nm or below. In this Description, it should be noted that the EUV light means a ray having a wavelength in a soft X ray region or a vacuum ultraviolet ray region, specifically a ray having a wavelength of about 10 to 20 nm, in particular, of about 13.5 nm±0.3 nm.

It is impossible to use EUV light in conventional dioptric systems as in photolithography using visible light or ultraviolet light since EUV light is apt to be absorbed by any substances and since substances which absorb EUV light have a refractive index close to 1. For this reason, a catoptric system, i.e., a combination of a reflective photomask and a mirror, is employed in EUV light lithography.

A mask blank is a laminated member for fabrication of a photomask, which has not been patterned yet. When a mask blank is used for a reflective photomask, the mask blank has a structure wherein a substrate made of glass or the like has a reflective layer for reflecting EUV light and an absorbing layer for absorbing EUV light formed thereon in this order. The reflective layer is normally a multilayer film, which comprises high refractive layers and low refractive layers alternately laminated to increase a light reflectance when irradiating a film surface with a ray, more specifically when irradiating a film surface with EUV light. The absorbing layer comprises a material layer, which contains a material having a high absorption coefficient in connection with EUV light, as the main component (for example, see Patent Document 1).

The reflective layer and the absorbing layer are deposited by ion beam sputtering or magnetron sputtering. When the reflective layer and the absorbing layer are deposited, the substrate is supported by a chucking and supporting means in a film deposition chamber. Although there are a mechanical chuck and an electrostatic chuck as the chucking and supporting means, an electrostatic chuck is preferably used because of a reduction in the generation of dust during chucking or another reason. However, when the substrate has a low conductivity as in a glass substrate, there is a risk that dielectric breakdown is caused since a high voltage is required to be applied in order to obtain a chucking force at the same level as, e.g., a silicon wafer.

In order to solve such a problem, Patent Documents 2 and 3 have proposed forming a chucking layer for chucking and supporting a substrate by an electrostatic chuck (hereinbelow, also referred to as the chucking layer). These documents have described that the above-mentioned chucking layer comprises a conductive film made of a material having a higher conductivity than glass substrates, such as Si, Mo, Cr, chromium oxynitride (CrON) or TaSi.

Further, Patent Document 4 has described that the chucking layer may comprise a film made of, e.g. $BaTiO_3$, or PZT ($PbZr_1-xTi_xO_3$), which causes dielectric polarization by application of an electric field, in addition to the above-mentioned conductive films.

Patent Document 1: JP-A-2002-319542 (U.S. Pat. No. 6,749,973)
Patent Document 2: JP-A-2003-501823
Patent Document 3: JP-A-2005-210093
Patent document 4: JP-A-2000-208594

SUMMARY OF THE INVENTION

When the above-mentioned reflective layer is formed on a front surface of a substrate, and when a film, which chucks and supports the substrate by an electrostatic chuck, is formed on a rear surface of the substrate, there is a possibility that the provision of the films on both surfaces of the substrate causes electrical connection between the respective films. When electrical connection is caused, there is a problem that particles are attracted to increase the formation of substrate defects by static build-up on the substrate.

In order to fabricate an EUV mask, it is necessary to perform different kinds of processes, such as a process wherein different kinds of layers, such as a reflective layer, an intermediate layer and an absorbing layer, are deposited, a process wherein a laser ray, an electron beam or the like is used to write a pattern on a resist film on an EUV mask blank, and a process wherein a fine circuit pattern written on the EUV mask is used to be written in a reduced size on a resist on a substrate, such as a Si wafer, by a projection aligner. In such different kinds of processes, it is necessary to minimize the adhesion of particles on a layer surface or into a layer since when the number of particles is beyond an acceptable range, a desired fine circuit pattern is prevented from being written with good dimensional accuracy.

It is an object of the present invention to provide a substrate with a reflective layer, an EUV mask blank, and an EUV mask fabricated therefrom, which are capable of preventing a film formed on a front surface of a substrate and a film formed on a rear surface of the substrate from being electrically connected together, and of preventing particles from adhering to a layer surface or into a layer during fabrication of the reflective layer and an absorbing layer, thereby to reduce the formation of defects.

The present invention provides:

a substrate with a reflective layer, which is usable to fabricate a reflective mask blank for EUV lithography, comprising a chucking layer formed on a rear surface opposite a front surface with the reflective layer formed thereon, the chucking layer serving to chuck and support the substrate by an electrostatic chuck, wherein the reflective layer has no electrical connection to the chucking layer; and a reflective mask blank for EUV lithography, comprising a reflective layer and an absorbing layer formed on a substrate, and a chucking layer formed on a rear surface opposite a front surface with the reflective layer and the absorbing layer formed thereon, the chucking layer serving to chuck and support the substrate by an electrostatic chuck, wherein the reflective layer and the absorbing layer have no electrical connection with the chucking layer.

BRIEF DESCRIPTION OF THE DRAWINGS

FIG. 6 is schematic vertical cross-sectional views (FIGS. 6(a)(b)) of actual EUV mask blanks, which have been fabricated according to the method described in Patent Document 1;

FIG. 7 is schematic transverse cross-sectional views of EUV mask blanks with a chucking layer formed in a circular shape in FIG. 7(a) and in a square shape in FIG. 7(b) on a substrate;

FIG. 9 is schematic transverse cross-sectional views of EUV mask blanks with a reflective layer formed in a circular shape in FIG. 9(a) and in a square shape in FIG. 9(b) on a substrate;

EXPLANATION OF REFERENCE NUMERALS

Figure 1:
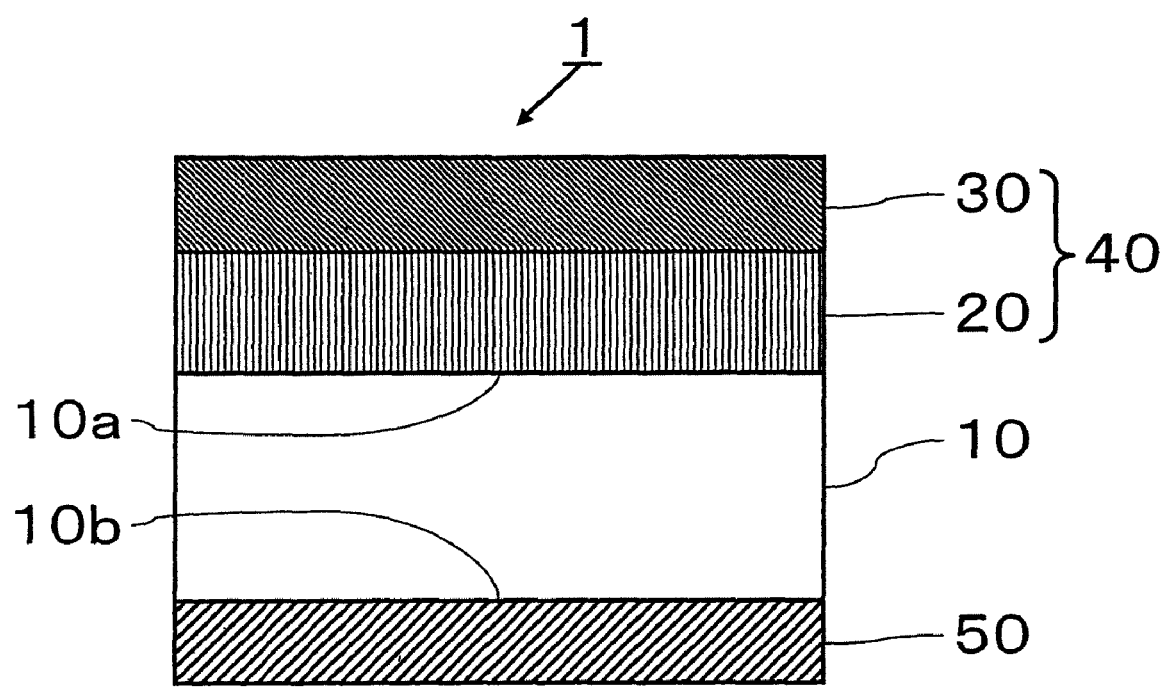
FIG. 1 is a schematic vertical cross-sectional view of an EUV mask blank according to the present invention.

1 and 100: EUV mask blank
10 and 11: substrate
10a: front surface of substrate
10b: rear surface of substrate
20: reflective layer
30 and 114: absorbing layer
40 and 115: laminated film
50 and 125: chucking layer
55: deleted portion
60: electrostatic chuck
65: non-conducting portion
80: insulating film
112: reflective layer
113: intermediate layer
120 and 130: wraparound portion
140: overlapping portion

DETAILED DESCRIPTION OF THE PREFERRED EMBODIMENTS

The substrate with a reflective layer, the EUV mask blank and the EUV mask according to the present invention can restrain particles from adhering to a layer surface and into a layer, thereby to fabricate an EUV mask having defects minimized and to make effective exposure possible since an interlayer electrical connection (an interlayer electrical connection between a reflective layer and a chucking layer, and an interlayer electrical connection between each of a reflective layer and an absorbing layer, and a chucking layer) is eliminated as stated above.

The EUV mask blank 1 according to the present invention is configured to comprise a substrate 10 having a reflective layer 20 formed on a front surface 10a thereof as shown in FIG. 1. The substrate 10 has a chucking layer for chucking and supporting the substrate by an electrostatic chuck (hereinbelow, also referred to as the chucking layer) 50, formed on a rear surface 10b thereof. It should be noted that most of EUV mask blanks are required to have an absorbing layer for absorbing EUV light 30 formed thereon, and to have an intermediate layer (not shown) formed between the reflective layer 20 and the absorbing layer 30 as needed. The intermediate layer plays a role to protect the reflective layer formed thereunder by serving as a layer to stop etching when a pattern master for a fine circuit pattern of a semiconductor is formed in the absorbing layer.

In the present invention, it should be noted that the "substrate with a reflective layer" means a substrate with a reflective layer and a chucking layer formed thereon, and that the "substrate with a chucking layer" means a substrate with only a chucking layer formed thereon.

A substrate, which is applied to an EUV mask blank or a substrate with a reflective layer, needs to satisfy properties required for a substrate for an EUV mask blank. For this reason, it is preferred that the substrate have a low coefficient of thermal expansion (which is preferably $0\pm1.0\times10^{-7}/°$ C., more preferably $0\pm0.3\times10^{-7}/°$ C., further preferably $0\pm0.2\times10^{-7}/°$ C., furthermore preferably $0\pm0.1\times10^{-7}/°$ C., and particularly preferably $0\pm0.05\times10^{-7}/°$ C.), and that the substrate be excellent in smoothness, flatness and resistance to a cleaning liquid used for, e.g., cleaning a mask blank or a patterned photomask. Although the substrate specifically comprises glass having a low coefficient of thermal expansion, such as $SiO_2$—$TiO_2$ glass, the substrate is not limited to comprise such glass. The substrate may comprise crystallized glass with a β quartz solid solution precipitated therein, quartz glass, silicon, metal or the like. It is preferred that the substrate comprise a substrate having a high rigidity. Specifically, it is preferred that the substrate have a specific rigidity of $3.0\times10^7$ $m^2/s^2$ or above and a Poisson's ratio of from 1.16 to 0.25.

$SiO_2$—$TiO_2$ glass is $SiO_2$ glass with $TiO_2$ doped therein. It is preferred that $SiO_2$—$TiO_2$ glass be silica glass containing 3 to 10 mass % of $TiO_2$. This is because there is a possibility that it is impossible to obtain zero expansion when the content of $TiO_2$ is less than 3 mass %. This is also because there is a possibility that the coefficient of thermal expansion is negative when the content of $TiO_2$ is beyond 10 mass %. The concentration of $TiO_2$ is preferably from 5 to 9 mass %.

It is preferred that the hydrogen molecule content of $SiO_2$—$TiO_2$ glass be less than $5\times10^{17}$ molecules/cm$^3$. This is because when an optical product for EUV lithograph is fabricated by depositing a reflective layer in a case of the hydrogen molecule content of the glass being $5\times10^{17}$ molecules/cm$^3$ or above, there is a possibility that there is caused a phenomenon wherein hydrogen molecules in the glass diffuse in a chamber to be taken into a film during film deposition under ultrahigh vacuum. This is also because there is a possibility that there is caused a phenomenon wherein hydrogen molecules gradually diffuse in a film during process under ultrahigh vacuum, forming a film containing hydrogen molecules. When one of these phenomenons has occurred, there is possibility that the density of the film has changed to deviate the multilayer film from its optical design, or the concentration of the hydrogen molecules is changed with the lapse of time to alter an optical characteristic of the multilayer film.

Further, it is preferred that $SiO_2$—$TiO_2$ glass have an OH group concentration of 600 wt.ppm or below. The reason why it is not preferred that the OH group concentration be higher than the above-mentioned value is that hydrogen is apt to diffuse and to be released since the trapping effect for hydrogen is restrained.

It is preferred from the viewpoint of obtaining a high reflectance and printing precision in a photomask after pattern formation that the substrate be configured so that a surface of a deposited reflective layer is a flat surface having a surface roughness of 0.15 nm or below in Rms (root-mean-square roughness, which is also applicable to later explanation) and having a flatness of 100 nm or below. On the other hand, it is preferred that the substrate have a rear surface comprising a flat surface having 0.5 nm or below in Rms in order to minimize the generation of dust caused by electrostatic chucking. Although the dimensions, the thickness and the like of the substrate are properly determined according to the design values of a mask or the like, it is usual to use $SiO_2$—$TiO_2$ glass having outer dimensions of 6 inch (152.4 mm) square and a thickness of 0.25 inch (6.3 mm) in most cases.

There are no particular limitations to the reflective layer used for the substrate with a reflective layer and for the EUV mask blank as long as the reflective layer has desired properties as the reflective layer for the EUV mask blank. The property that is particularly required for the reflective layer is that the reflective layer comprises a film having a high EUV light reflectance. Specifically, the maximum value of the light reflectance is preferably 60% or more, more preferably 65% or more with respect to a wavelength of 13.5 nm±5 nm when a ray in the wavelength range of the EUV light is applied on the surface of the reflective layer.

Examples of the reflective layer that satisfies the above-mentioned property include an Si/Mo multilayer film with Si films and Mo films alternately laminated therein, a Be/Mo multilayer film with Be films and Mo films alternately laminated therein, a Si compound/Mo compound multilayer film with Si compound films and Mo compound films alternately laminated therein, a Si/Mo/Ru multilayer film with a Si film, an Mo film and a Ru film laminated in this order therein, and a Si/Ru/Mo/Ru multilayer film with a Si film, an Ru film, a Mo film and a Ru film laminated in this order therein.

The process for depositing the reflective layer may be a process that is normally carried out when depositing a reflective layer by sputtering, such as magnetron sputtering or ion beam sputtering. For example, in the case of depositing a Si/Mo multilayer film by ion beam sputtering, it is preferred that a Si film be deposited so as to have a thickness of 4.5 nm, using a Si target as the target, using an Ar gas (having a gas pressure of $1.3\times10^{-2}$ Pa to $2.7\times10^{-2}$ Pa) as the sputtering gas, applying an iron acceleration voltage of from 300 to 1,500 V and setting the film deposition speed at a value of from 0.03 to 0.30 nm/sec., and then a Mo film be deposited so as to have a thickness of 2.3 nm, using a Mo target as the target, using an Ar gas (having a gas pressure of from $1.3\times10^{-2}$ Pa to $2.7\times10^{-2}$ Pa) as the sputtering gas, applying an ion acceleration voltage of from 300 to 1,500 V and setting the film deposition speed at a value of from 0.03 to 0.30 nm/sec. By laminating Si films and Mo films in 30 to 50 cycles, each of the cycles comprising the steps stated above, the Si/Mo multilayer film is deposited. It is preferred that the entire reflective layer have a thickness of from 200 to 400 nm.

There is no limitation to the method for depositing the reflective layer as long as film deposition is performed by sputtering. Either magnetron sputtering or iron beam sputtering is acceptable. It should be noted that it is preferred from the viewpoint of minimizing defects and obtaining a film having excellent uniformity in film thickness that film deposition be performed by iron beam sputtering.

When the reflective layer is deposited by sputtering, it is general that a substrate supported by a rotor, and film deposition is performed with the substrate being rotated for required uniformity in in-plane film thickness. It is preferred from the viewpoint of required uniformity in in-plane film thickness that the substrate with a reflective layer and the reflective layer used for an EUV mask blank according to the present invention be also fabricated so that the substrate is supported by an electrostatic chuck or the like, and film deposition is performed with the substrate being rotated by a rotor. It is preferred that not only the reflective layer but also another layer, such as the absorbing layer, the intermediate layer and the chucking layer, be also deposited with the substrate being rotated.

In the substrate with a reflective layer and the EUV mask blank according to the present invention, it is preferred from the viewpoint of preventing a surface of the reflective layer from being oxidized after film deposition that the reflective layer have a top layer comprising a composition layer, which is difficult to be oxidized. The composition layer, which is difficult to be oxidized, serves as a capping layer for the reflective layer. Specific examples of the composition layer, which serves as the capping layer and is difficult to be oxidized, include a Si layer, a Ru layer and a $TiO_2$ layer. When the reflective layer is a multilayer film comprising a Si/Mo film, the top layer can serve as a capping layer by being formed from an Si layer. In that case, it is preferred that the capping layer have a film thickness of 11.0±2 nm, particularly 11.0±1 nm.

Each of the substrate with a reflective layer and the EUV mask blank according to the present invention has the chucking layer formed on the surface (the rear surface) opposite the front surface with the reflective layer disposed thereon. The chucking layer serves as a chucking member for an electrostatic chuck, which is used as a supporter during film deposition and exposure of a mask. The chucking layer is one that chucks and supports a substrate by an electrostatic chuck. It is preferred that the chucking layer comprise a conductive film having a high conductivity or a dielectric film causing dielectric polarization by application of an electric field, in consideration of how to chuck a substrate by an electrostatic chuck. Specifically, the chucking layer preferably comprises a film having a volume resistivity of $10^6$ Ω·cm or below, in particular a film having a volume resistivity of $10^5$ Ω·cm or below. The volume resistivity may be measured by a four-point probe method for a conductive film (film having a volume resistivity of $10^{-3}$ Ω·cm or below) and measured according to ASTM-D257 for a dielectric film. When the chucking layer comprises a conductive film, it is preferred from the viewpoint of preventing the reflective layer from being subjected to dielectric breakdown that the conductive film have a sheet resistance of 100 Ω/square or below.

It is preferred that the chucking layer have a high surface hardness. This is because when a substrate with the chucking layer is chucked and supported by an electrostatic chuck to be used for fabrication of a substrate with a reflective layer or an EUV mask blank, it is possible to prevent particles from being generated by friction between the electrostatic chuck and the chucking layer. It is preferred that the chucking layer have a Vickers hardness of 200 or above. When the chucking layer has a Vickers hardness of 200 or above, there is an advantage in preventing particles from being generated by friction between an electrostatic chuck and the chucking layer when a substrate with the chucking layer is fixed to the electrostatic chuck to be used for fabrication of an EUV mask blank.

It is preferred from the viewpoint of preventing particles from being generated by friction between an electrostatic chuck and the chucking layer that the surface of the chucking layer be excellent in smoothness. Specifically, it is preferred that the surface of the chucking layer have a smoothness of 2 nm or below in Rms. When the surface of the chucking layer has a smoothness of 2 nm or below in Rms, there are advantages not only in being capable of obtaining a sufficient chucking and holding force in a stable way but also in preventing particles from being generated by friction between an electrostatic chuck and the chucking layer when a substrate with the chucking layer is fixed to the electrostatic chuck.

The chucking layer may be configured to have a laminated structure (e.g., a two-layer structure made of Cr with a lower layer containing no B and an upper layer containing B) or a graded composition structure (e.g., a layer with the content of B gradually changed according to film thicknesses).

There is no limitation to the chucking layer as long as the chucking layer satisfies the requirement of the sheet resistance stated above. The chucking layer is preferably made of at least one metal material selected from the group consisting of Cr, Ni, Ti, Ta, Mo, Si and W. In particular, the chucking layer is preferably made of Cr for the reason stated below. It is preferred in terms of chucking ability that the content of the metal material in the chucking layer be from 10 to 70 atom %. The chucking layer may be made of a metal oxide material, such as ITO or tin oxide.

Since it is preferred to firmly fix a substrate by an electrostatic chuck, it is preferred that the conductive film have a sheet resistance of 100 Ω/square or below. The sheet resistance of the conductive film is determined by the electrical conductivity, the area and the film thickness of the conductive film. Cr is effective to set the sheet resistance of the conductive film at a value 100 Ω/square or below since Cr has a high electrical conductivity. When the conductive film is made of Cr, the conductive film is excellent in adhesion to a substrate.

The chucking layer may contain B (boron) in an average concentration of from 1 to 70 atom % in addition to a metal material stated above. In other words, the chucking layer is preferably a film comprising metal and B. The chucking layer may have N contained therein. It is preferred from the viewpoint of increasing a stress (specifically a compressive stress) caused in the chucking layer that the chucking layer contain N.

The chucking layer may be made of elemental metal or a metal nitride. When the chucking layer is made of a metal nitride, it is preferred that the above-mentioned materials contain no oxygen (O). The chucking layer may have different compositions in the film thickness direction thereof. The chucking layer may have a portion close to a substrate containing nitrogen (N) and a portion close to an outer surface containing oxygen (O) and carbon (C).

In a case wherein a substrate is fixed by an electrostatic chuck during exposure, when the chucking layer comprises a conductive film, it is preferred that the conductive film have a sheet resistance of 100 Ω/square or below as stated above. However, it should be noted that this is a resistance value required for fixing a substrate. When the reflective layer is deposited, it is necessary to deposit the reflective layer with the substrate being rotated in some cases. In such cases, it is necessary to increase the electrostatic force in order to prevent the substrate from falling away during rotation. Specifically, it is preferred that the conductive film have a sheet resistance of 20 Ω/square or below.

It is preferred that the chucking layer have a film thickness of from 10 to 500 nm. When the chucking layer has a film thickness of less than 10 nm, there is a possibility that the chucking force is insufficient when a substrate with the chucking layer is fixed to an electrostatic chuck. There is another possibility that abnormal electric discharge is caused to generate particles during deposition on the deposition surface of a substrate by sputtering. There is another possibility that a substrate with the chucking layer is subjected to dielectric breakdown when the substrate is fixed to an electrostatic chuck and when a high voltage is applied. It is not preferred that the chucking layer have a film thickness of greater than 500 nm. This is because an increase in film thickness beyond that value does not contribute to improvement in the chucking force, because a time required for formation of the chucking layer increases, and because a cost required for formation of the chucking layer increases. Further, there is a possibility that the probability of occurrence of film peeling increases since the film thickness of the chucking layer is greater than needed. The film thickness of the chucking layer is preferably from 30 to 400 nm, particularly from 50 to 200 nm.

The chucking layer may be formed by a known deposition method, e.g., a magnetron sputtering method, a sputtering method, such as ion beam sputtering, a CVD method, a vacuum deposition method, an electrolytic plating method or the like.

When an EUV mask blank is patterned, an electron-beam writing technique is normally employed to perform patterning in order to form a fine pattern. In order to perform patterning by an electron-beam writing technique, a resist for electron-beam writing is first applied on a surface of the absorbing layer of the EUV mask blank, followed by performing a baking treatment, such as a baking treatment at a temperature of from 100 to 200° C. Next, an electron-beam writing system is employed to apply an electron beam on the resist, and the resist is developed to form a resist pattern. These steps are mainly carried out with the EUV mask blank being fixed to an electrostatic chuck.

When the EUV mask is used to project, in a reduced size, the fine circuit pattern formed on the mask, on a resist film on an Si wafer, the substrate temperature of the EUV mask is consequently increased since the reflective layer of the EUV mask has a reflectance of from about 60 to 70% with the results that 30 to 40% of the light incoming into the EUV mask is absorbed by the EUV mask itself.

When the EUV mask blank is patterned or when the EUV mask is used to project the fine circuit in a reduced size and perform exposure, the temperature of the EUV mask is increased by absorption of an electron ray or an ultraviolet ray (EUV light). A temperature increase in the EUV mask is not preferred because of having a possible adverse effect on pattern accuracy. From this point of view, an investigation has been made on cooling of an EUV mask during patterning.

Various ways could be proposed as the way to cool an EUV mask. For example, there are a way to cool a substrate by passing a liquid or gas in an electrostatic chuck, and a way to cool a substrate by passing a gas in a gap between a pin chuck and the substrate. In these ways, the thermal conductivity of the chucking layer has a significant effect on the cooling efficiency of a substrate. When the chucking layer has a thermal conductivity of 2.8 J/cm·sec·° C. or above, a substrate is not adversely affected in terms of cooling efficiency since the chucking layer is excellent in thermal conductivity. The chucking layer has more preferably a thermal conductivity of 3.0 J/cm·sec·° C. or above, further preferably a thermal conductivity of 3.2 J/cm·sec·° C. or above.

Figure 2:
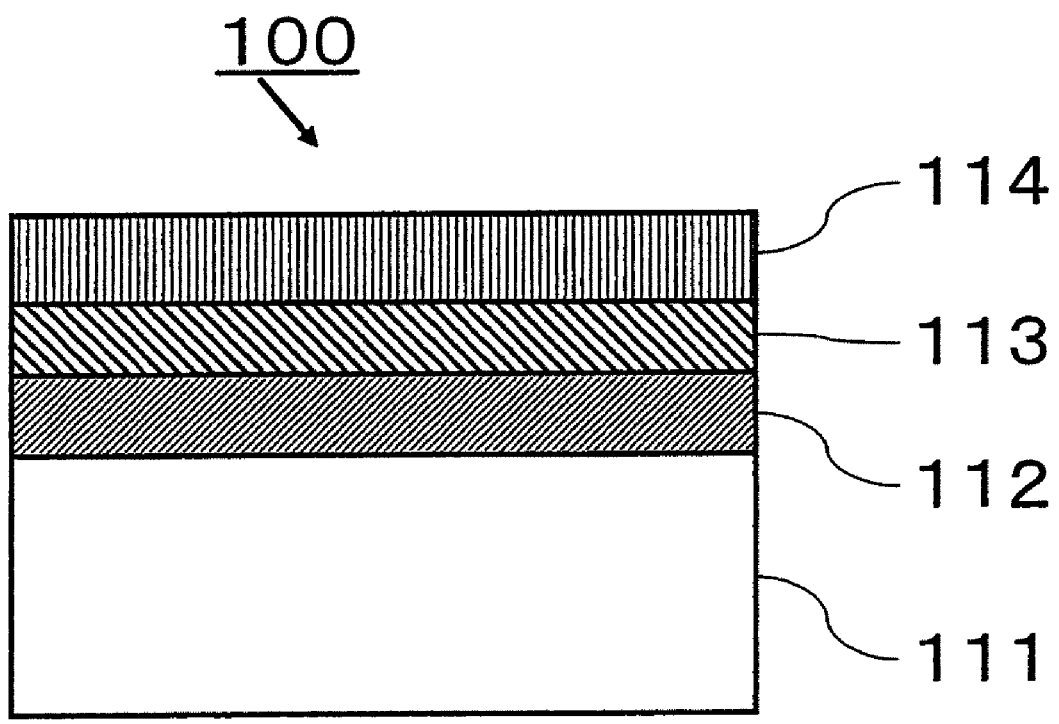
FIG. 2 is a schematic vertical cross-sectional view of the substrate with a reflective layer disclosed in the drawings of Patent Document 1.

The substrate with a reflective layer according to the present invention is characterized in that the reflective layer has no electrical connection to the chucking layer. The EUV mask blank according to the present invention is characterized in that the reflective layer and the absorbing layer have no electrical connection with the chucking layer. In general, the reflective layer, the absorbing layer and the chucking layer are normally formed by sputtering in terms of required smoothness, a reduction in defects and the like. FIG. 2 of the present application is a cross-sectional view of the EUV mask blank disclosed in FIG. 1 of Patent Document 1, wherein the EUV mask blank 100 is configured to have a reflective layer 112, an intermediate layer 113 and an absorbing layer 114 laminated on a substrate 111 in this order.

When film deposition is performed, without taking any particular measure, by sputtering, sputtered particles are coming toward a substrate from the target so that the coming direction of the sputtered particles spreads so as to have some degree of distribution. There is a possibility that sputtered particles collide with another particle or an element in the atmosphere in the middle of coming toward the substrate with the result that the collided sputtered particles fail to have a uniform directivity to make the coming direction of the sputtered particles chaotic. By the distribution of the incident angles and the chaotic state of the sputtered particles stated above, the sputtered particles not only collide with a surface of the substrate to be accumulated on the surface but also spontaneously warp around a lateral surface and a rear surface of the substrate. When a specific film is deposited by sputtering or the like, the specific film may be deposited with a substrate being slanted with respect to the incident direction of the sputtered particles coming from the target (the incident angle of the most sputtered particles coming toward the substrate) in order to secure and improve uniformity in the film thickness of the film. In this case, when film deposition is performed without taking any particular measure, the film is not only deposited on a front surface of the substrate but also spontaneously deposited on a lateral surface or a rear surface of the substrate.

For example, Patent Document 1 describes in the explanation of an example that the reflective layer (and the absorbing layer) was deposited by a DC magnetron sputtering method. It is supposed that the films wrapped around a lateral surface or a rear surface of the substrate in this sputtering method as stated above since any particular measure was not taken. Although FIG. 1 of Patent Document 1 shows the EUV mask blank shown in FIG. 2 of the present application as the EUV mask blank fabricated in the example of this Patent Document, it is supposed that the actually fabricated EUV mask blank was configured to have the reflective layer (and the absorbing layer) deposited so as to extend on a lateral surface of the substrate, even on the rear surface of the substrate in some cases, as shown in FIG. 3.

Figure 3:
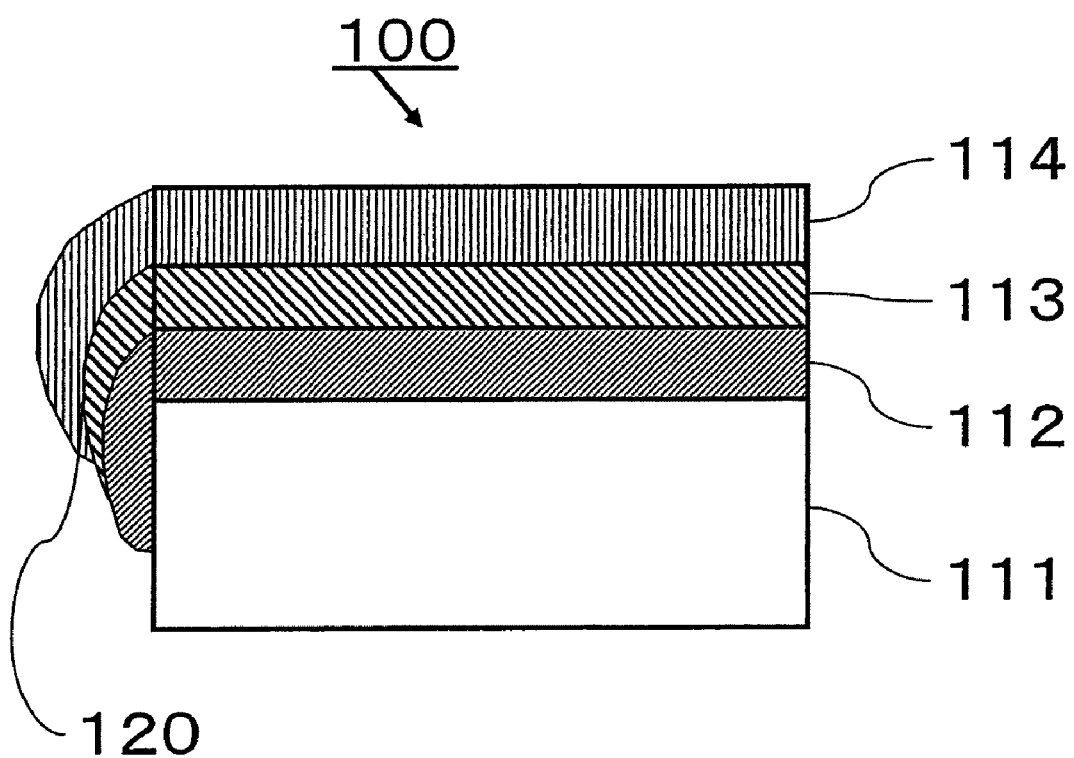
FIG. 3 is a schematic vertical cross-sectional view of an actual substrate with a reflective layer, which has been fabricated according to the method described in Patent Document 1.

In FIG. 3, the EUV mask blank is configured not only to have the reflective layer 112, the intermediate layer 113 and the absorbing layer 114 laminated on the substrate 111 in this order as in FIG. 2 but also to have a wraparound portion 120 formed in a laminated structure on the lateral surface, the wraparound portion being formed by sputtered particles that have arrived on the lateral surface of the substrate. It should be noted that each of the reflective layer 112, the intermediate layer 113 and the absorbing layer 114 is deposited by a sputtering method in many cases. In such cases, wrapping around is caused in deposition of each of the layers, and the wraparound portion 120 is finally formed. It should be noted that although the wraparound portion 120 made of the respective layers is shown to be formed only on the left lateral surface in FIG. 3, the wraparound portion 120 is actually formed on the entire periphery of the substrate since in order to secure uniformity in the film thickness of each of the deposited films, film deposition is usually performed with the substrate being rotated. The wraparound portion 120 is also formed even on the rear surface of the substrate in some cases. In such cases, the wraparound portion ends up being formed on the entire periphery of the rear surface.

Figure 4:
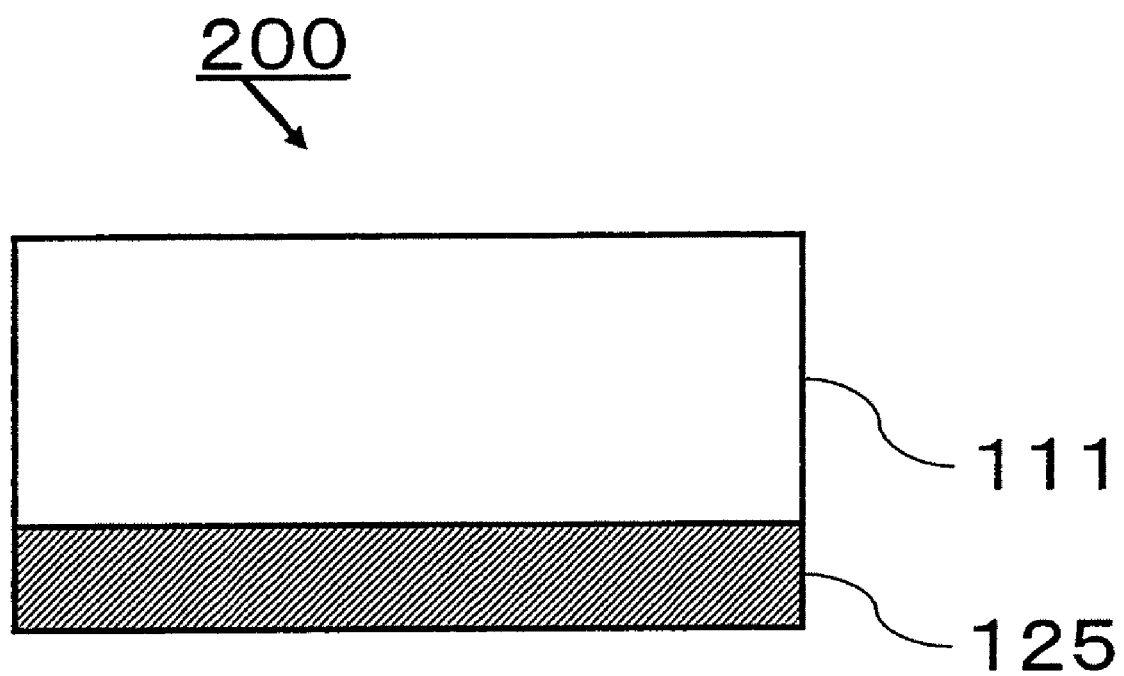
FIG. 4 is a schematic vertical cross-sectional view of the substrate with a chucking layer disclosed in the drawings of Patent Document 1.

The chucking layer also forms a wraparound portion for the same reason. For example, FIG. 4 of the present application shows a cross-sectional view of a substrate with a chucking layer for an EUV mask blank 200, which has a chucking layer 125 formed on a rear surface of a substrate 111 as shown in FIG. 4 of Patent Document 2.

When the chucking layer is deposited by a normal sputtering method without taking any particular measures, the deposited film not only is laminated on a front surface of the substrate 111 but also spontaneously wraparound a lateral side and a rear surface of the substrate 111 as stated above. Accordingly, the substrate with the chucking layer that is actually fabricated has a structure as shown in FIG. 5.

Figure 5:
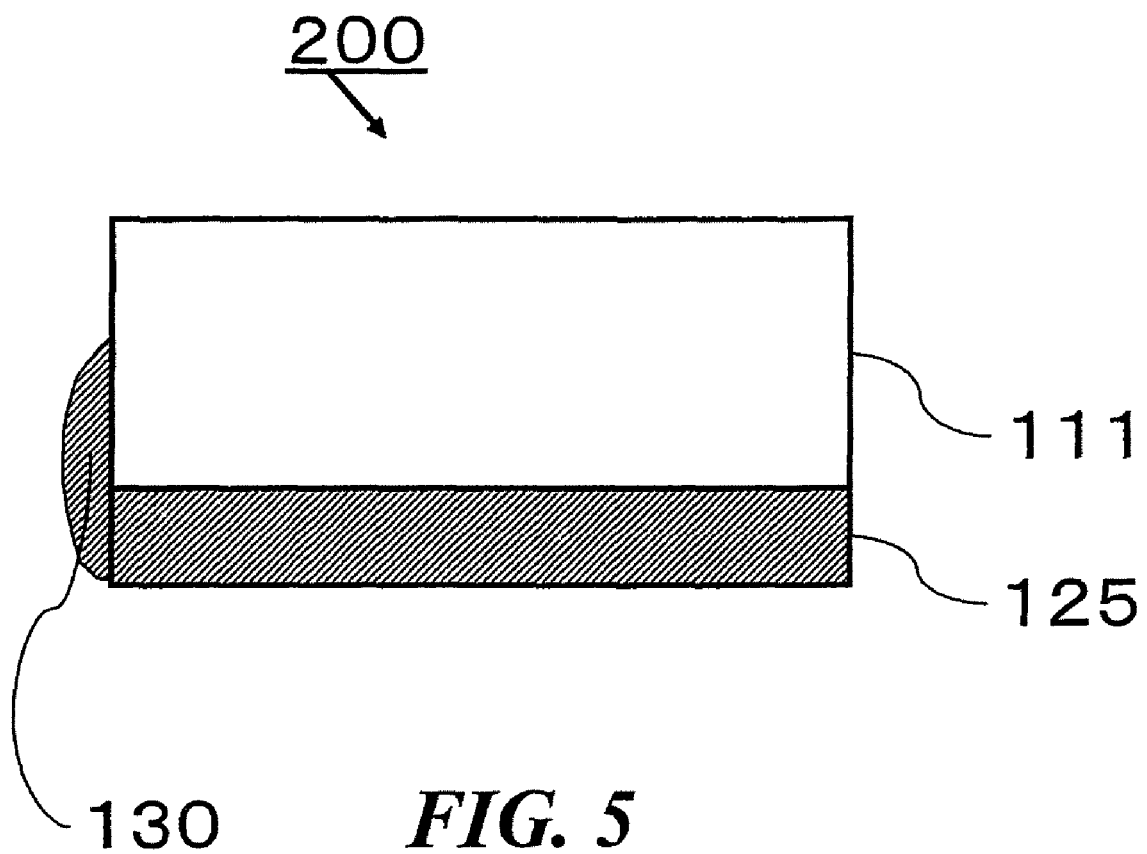
FIG. 5 is a schematic vertical cross-sectional view of an actual substrate with a chucking layer, which has been fabricated according to the method described in Patent Document 1.

In FIG. 5, the substrate 111 is configured to have not only the chucking layer 125 deposited on the rear surface thereof but also a wraparound portion 130 formed in a laminated structure on the lateral side as in the reflective layer shown in FIG. 3, the wraparound portion being formed by sputtered particles that have arrived on the lateral side of the substrate. As in the reflective layer, the wraparound portion 130 is formed on the enter periphery of the lateral side of the substrate, and the wraparound portion is also formed even on the entire periphery of the front surface of the substrate in some cases.

When an EUV mask blank is fabricated, it is normal and general to adopt a method wherein a chucking layer is formed on a rear surface of a substrate, followed by forming a reflective layer, an intermediate layer and an absorbing layer while electrostatically chucking and supporting the chucking layer to chuck and support the substrate. For this reason, when film-deposition is performed in an EUV mask blank without taking any particular measure, the wraparound portion 120 shown in FIG. 3 and the wraparound portion 130 shown in FIG. 5 overlap together to form an overlapping portion 140 as shown in FIG. 6(a). The result is that the reflective layer 115 and the chucking layer 125 are electrically connected together. Although the wraparound portions 120 and 130 are not referred to in Patent Documents 1 and 2 as stated above, these portions are necessarily formed when film deposition is performed by a normal sputtering method without taking any particular measure. It should be noted that the overlapping portion 140 can be formed on the entire periphery of the front surface of the substrate as in the wraparound portions 120 and 130 in this case as well.

Although the overlapping portion 140 is shown to be formed on the lateral side of the substrate in FIG. 6, there is a possibility that the overlapping portion 140 is also formed on a surface of the substrate to have the reflective layer formed thereon and a surface of the substrate to have the absorbing layer formed thereon according to the conditions set for deposition of films as shown in FIG. 6(b). It should be noted that the overlapping portion 140 can be formed on the entire periphery of the rear surface of the substrate as in the wraparound portions 120 and 130 in this case as well.

Now, what problems are caused by the formation of the above-mentioned electrical connection will be explained.

When a substrate with a reflective layer or an EUV mask blank is fabricated, there is a possibility that film-peeling of an absorbing layer, abnormal discharge during film deposition or the like generates particles since the chucking layer and an electrostatic chuck are brought into contact with each other during film deposition. The generation of particles causes a problem that it is impossible to obtain a high quality product (a substrate with a reflective layer, an EUV mask blank or an EUV mask) because of an increase in the formation of defects in the product. In a case wherein a pattern is written by using a conventional transmission mask, even when a defect of irregularities is caused on a mask surface, the presence of such a defect have seldom had a significant adverse effect since exposure light has a relatively long wavelength, which is in an ultraviolet range (about 150 to about 247 nm). For this reason, no special recognition has been given, as a problem to be solved, to the generation of particles during film deposition. However, when light having a short wavelength as in EUV light is used as exposure light, it is impossible to ignore the generation of particles since even the presence of a defect of fine irregularities has a significant adverse effect to a printed image.

Figure 8:
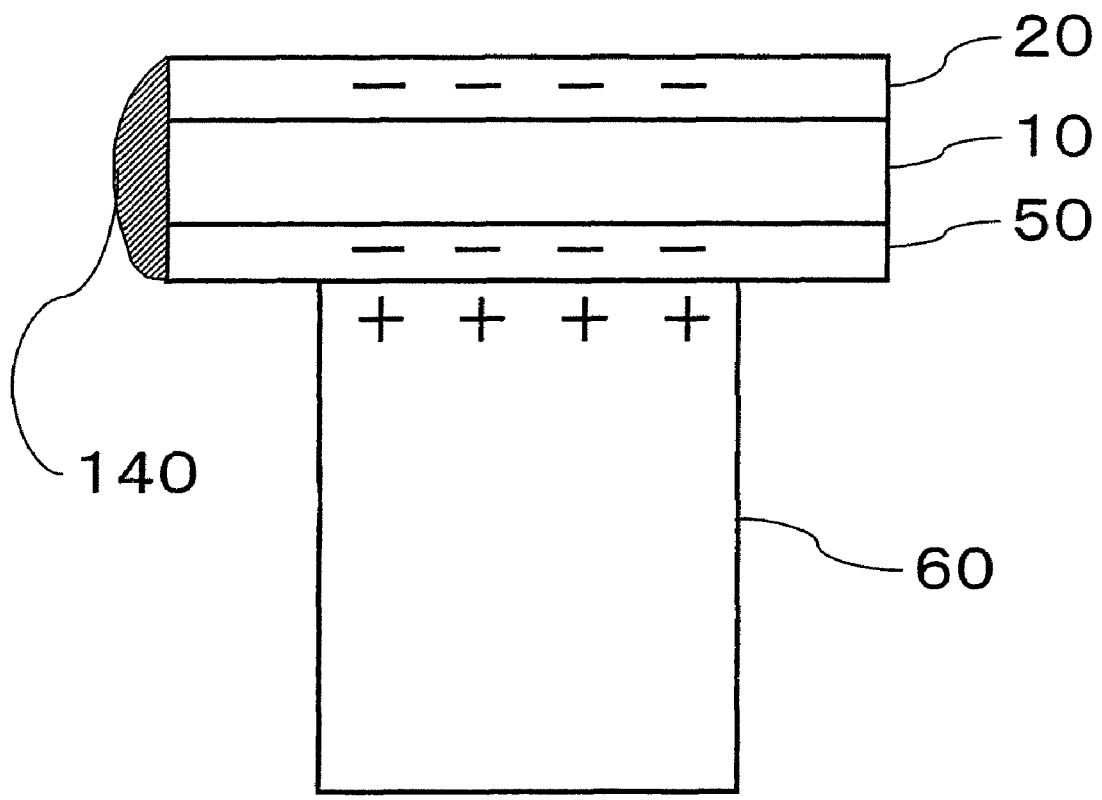
FIG. 8 is a schematic vertical cross-sectional view showing a state of charges when an EUV mask blank having electrical connection is electrostatically chucked.

A problem, which is caused by the formation of electrical connection, will be explained, referring to FIG. 8. FIG. 8 shows a cross-sectional view wherein an electrostatic chuck 60 is used to chuck and support a substrate 10. By positively (or negatively) charging the electrostatic chuck, it is possible to firmly fix a chucking layer 50 and the electrostatic chuck 60 in an electrostatic sense. Accordingly, a side of the substrate (the chucking layer 50) in contact with the electrostatic chuck 60 is charged by electric charges opposite the electric charges of the electrostatic chuck, i.e., positively (or negatively) charged. If a reflective layer 20 and the chucking layer 50 are electrically connected together by the formation of the overlapping portion 140, a substrate surface to have the reflective layer, an intermediate layer and an absorbing layer deposited thereon is electrically charged since electric charges, which have been charged in the chucking layer, flow to the side of the reflective layer as well.

When the substrate surface is electrically charged as stated above, some of particles are attracted to the substrate surface negatively (or positively) charged, resulting in an increase in the number of defects in a film, since it is normal that the particles in a chamber for performing film deposition by a sputtering method are positively or negatively charged. When the reflective layer comprises a multilayer film, the substrate surface can be electrically charged just after deposition of a first layer in the reflective layer since there is a possibility that electrical connection is formed even after formation of the first layer. From this point of view, there is a possibility that during deposition of all other films forming the multilayer film, particles are attracted to finally cause defects in the reflective layer in a wide range. The phenomenon that particles are attracted to the substrate surface can occur not only during deposition of the reflective layer but also during deposition of the absorbing layer or the intermediate layer. In the later case, adhesion of particles is further enhanced.

When a film formed on a surface of the substrate to be patterned is electrically connected to the chucking layer formed on the rear surface of the substrate for chucking and supporting by an electrostatic chuck in an EUV mask blank or an EUV mask, another problem is caused as follows. In a process for writing a fine circuit pattern on a resist film on an EUV mask blank by an electron beam or a laser beam, a process for patterning the absorbing layer on the EUV mask blank by plasma etching, and a process for performing exposure in order to write, in a reduced size, a pattern on a resist film on a Si wafer by the EUV mask with the pattern formed therein, the EUV mask blank and the EUV mask are chucked and supported by an electrostatic chuck. In each of the processes, there is a possibility that a film formed on a substrate surface is also electrically charged, causing damage, such as dielectric breakdown, to a formed pattern for the reason stated above.

In the present invention, it has been found in consideration of the above-mentioned problems that a substrate with a reflective layer and an EUV mask blank are configured so that a reflective layer (and a absorbing layer) has no electrical connection to a chucking layer, thereby preventing a film formed a substrate surface from being electrically charged and preventing particles from being attracted to the substrate by, e.g., an electrostatic force, with the result that the substrate with a reflective layer and the EUV mask blank can be fabricated with the occurrence of defects minimized.

Further, the present invention has another advantage in preventing a film from wrapping around a lateral surface of the substrate to avoid the occurrence of film peeling from the lateral surface caused by contact with something during transportation of the substrate, with the result that particles is prevented from being caused by film peeling.

The phrase "no electrical connection" means that in the case of a substrate with a reflective layer, the resistance value between a reflective layer and a chucking layer is 1 MΩ or above, is preferably 5 MΩ or above, is more preferably 10 MΩ or above, is further preferably set at such a high level that is impossible to measure. The resistance value between the reflective layer and the chucking layer may be represented by a resistance value, which is measured, by a two-point probe method or a four-point probe method, between two points of a point in an region corresponding to an exposure region (normally a square region of 104×132 mm in a central portion of the substrate) and a point in an region of a film formed on the rear surface of the substrate to be used for electrostatic chucking by an electrostatic chuck. In the case of an EUV mask blank, the phrase means that the resistance value between a reflective layer and a chucking layer, and the resistance value between an absorbing layer and the chucking layer (a low-reflective layer, if any) are a value as stated above.

Each of the overlapping portions 140 shown in FIG. 6 is preferably as small as possible, particularly does not exist for the reasons stated above. In a case wherein an insulating film stated later is formed, even when an overlapping portion 140 exists, no problem is caused because the insulating film prevents the electrical connection from being caused.

The substrate with a reflective layer, wherein a reflective layer is prevented from being electrically connected to a chucking layer as stated above, may be realized in the following modes. Although the following modes are directed to a case wherein the reflective layer is prevented from being electrically connected to the chucking layer, the modes are also applicable to an EUV mask blank, which a reflective layer and an absorbing layer are prevented from being electrically connected to the chucking layer.

(First Mode)

In a first mode, a chucking layer forming region is set so as to be smaller than a substrate. Specific examples of the first mode include a mode wherein the chucking layer is formed only on a central portion of the substrate without being formed on a peripheral portion close to a substrate edge, and a mode wherein the substrate has a non-conducting portion formed on a rear surface thereof to eliminate electrical conduction. Even when a reflective layer has wrapped around, films can be prevented from being overlapped. No electrical connection is caused since because of a reduction in the chucking layer forming region, the chucking layer forming region is apart from a region where the reflective layer has wrapped around. For this reason, it is preferred that the non-conducting portion be formed throughout the entire periphery of the substrate as shown in FIG. 7.

The region where the chucking layer 50 is formed is set so that the region where the chucking layer 50 is apart from an edge of the substrate 10 by a distance D of preferably 2 mm or above, more preferably 35 mm or above, further preferably 50 mm or above and 100 mm or below irrespectively of whether the chucking layer is formed in a circular shape as shown in FIG. 7(a) or a square shape as shown in FIG. 7(b). When the non-conducting portion forming region is represented by the minimum value d in the width of this forming region (which means the narrowest width of the non-conducting portion in the entire periphery of the substrate in consideration of a case wherein the non-conducting portion does not have a uniform width), the non-conducting portion forming region have a minimum width of preferably 2 mm or above, more preferably 35 mm or above, further preferably 50 mm or above and 100 mm or below. The position where the non-conducting portion is formed is not limited to an edge of the substrate. As long as the position where the non-conducting portion is formed is located in the ranges stated above, the electrical connection between the reflective layer and the chucking layer can be eliminated, allowing the substrate with the reflective layer to be fabricated with the occurrence of defects minimized.

Patent Document 3 describes in paragraph 0019 that it is possible to prevent particles from being generated from a peripheral edge of a substrate during electrostatic chucking by avoiding the formation of a chucking layer in the range of 30 mm from a substrate edge. It is correct that when a film is not formed in a peripheral portion of a substrate, it is possible to prevent particles from being generated from such a peripheral portion by film peeling. However, when a reflective layer is formed, or when an intermediate layer or an absorbing layer is formed on the reflective layer, each film wraps around not only a lateral surface of the substrate but also on a rear surface of the substrate in many cases. For this reason, even when the chucking layer is not formed in the range of 30 mm from a substrate edge, there is a possibility that the reflective layer is laminated in that region, resulting in the chucking layer being electrically connected to the reflective layer. In other words, the object of the present invention cannot be attained by the method disclosed by Patent Document 3.

The film shape of the chucking layer is not limited to be a circular shape (shown in FIG. 7(a)), an oval shape, a polygonal shape, such as a triangular shape or a square shape (shown in FIG. 7(b)) or the like. However, it is preferred in terms of adhesion that the chucking layer be formed in the same shape as an electrostatic chuck, in other words, the chucking layer be in the same circular shape as or a smaller circular shape than an electrostatic chuck, specifically the chucking layer be formed in such a circular shape so as to have the same diameter as that of the cross-sectional shape of an electrostatic chuck since the electrostatic chuck is formed in a circular shape in many cases. The chucking layer is preferably smaller than an electrostatic chuck for the following reason.

It is also preferred that the region where the chucking layer is formed have a smaller area than the contact area of an electrostatic chuck with the substrate when the substrate is supported by the electrostatic chuck. From this point of view, when an electrostatic chuck is formed in a circular shape, it is preferred that the circular shape of the chucking layer have a smaller area than the contact area of the electrostatic chuck with the substrate when the substrate is supported by the electrostatic chuck. The reason will be explained below.

When a Si/Mo multilayer film, which is formed by alternately depositing Si films (layers having a low refractive index and having a film thickness of 4.5 nm) and Mo films (layers having a high refractive index and having a film thickness of 2.3 nm) in totally 30 to 50 layers, is deposited as a reflective layer on a substrate by an ion beam sputtering method, a compressive stress of from 400 to 500 MPa is applied to the substrate by deposition of the reflective layer. When the reflective layer is deposited, the substrate is chucked and supported by an electrostatic chuck.

For example, when a compressive stress of from 400 to 500 MPa, which is caused by deposition of a reflective layer, is applied to a glass substrate, which is generally used as a $SiO_2$—$TiO_2$ substrate for an EUV mask blank (having outer dimensions of 6 inch (152.4 mm) square, a thickness of 6.3 mm, a coefficient of thermal expansion of $0.2 \times 10^{-7}/°$ C., a Young's modulus of 67 GPa and a specific rigidity of $3.1 \times 10^7$ $m^2/s^2$), the substrate is deformed so as to be warped in a convex shape having a height of from about 1.9 to 2.1 μm toward a side of the substrate with the reflective layer deposited thereon. In the case of an EUV mask blank, the allowable limit of flatness is 100 nm or below from end to end of the mask blank. The flatness of a substrate after deposition of a reflective layer means flatness on the reflective layer.

When such a compressive stress is caused, the substrate is deformed so as to have a central portion swollen by this compressive stress as viewed form the side of the reflective layer. When the rear surface of a substrate is supported by an electrostatic chuck during film deposition, deposition of a reflective layer causes a central portion of the substrate to be swollen, with the result that a greater force (adhesion stress between the electrostatic chuck and the substrate) is applied to an edge portion of the electrostatic chuck between the electrostatic chuck and the substrate. During film deposition, a substrate is rotated in order to minimize variations in film thickness in many cases. The greatest force is applied to an edge portion of an electrostatic chuck among the contacted portions between the electrostatic chuck and the substrate. From this point of view, a film can be prevented from being formed on that portion to avoid the generation of particles, which is caused by the provision of a chucking layer since the electrostatic chuck and the substrate are brought into contact with each other at the time of film deposition. Although explanation has been made on the assumption that a substrate is chucked and supported by a single electrostatic chuck, the present invention is applicable to not only a case wherein a single electrostatic chuck is used but also a case wherein a plurality of electrostatic chucks are used.

It is preferred from the viewpoint of preventing particles from being generated because of the provision of a chucking layer that when a substrate is supported by an electrostatic chuck, the chucking layer forming region be set inwardly by a distance of 1 mm or above, more preferably by a distance of 5 mm, further preferably by a distance of 10 mm, from an edge of an region where the electrostatic chuck is brought into contact with the substrate. In other words, it is preferred that in a case wherein a substrate is supported by an electrostatic chuck, when the non-conducting portion forming region is represented by the minimum value in the width of this forming region measured from an edge of a region where the electrostatic chuck is brought into contact with the substrate, the non-conducting portion forming region have a minimum width of preferably 1 mm or above, more preferably a minimum width of 5 mm or above, further preferably a minimum width of 10 mm.

For example, when an electrostatic chuck is formed in a circular shape so as to have a diameter of 100 mm, it is preferred that a chucking layer forming region be formed in a circular shape so as to have a diameter of 98 mm or below, more preferably a diameter of 90 mm or below, further preferably a diameter of 80 mm or below.

Examples of the method wherein a chucking layer forming region is made smaller than a rear surface region of a substrate, or a non-conducting portion is formed as stated above include (1) a method for depositing a chucking layer on a substrate while using a shielding member, such as a shielding mask, and (2) a method for depositing a chucking layer on the entire surface of a substrate, followed by removing a portion of the deposited chucking layer.

The method for depositing a chucking layer while using a shielding member is one wherein a non-conducting portion is formed by disposing a shielding member between a substrate and a target in a film deposition chamber to prevent sputtered particles from reaching a lateral surface and a rear surface of the substrate in order to physically prevent a film from being deposited on the lateral surface and the rear surface. The shielding member may comprise a shielding mask, which is processed so as to conform to the shape of a chucking layer forming region, or a baffle, which shuts down a passage for film deposition. It is preferred from the viewpoint of allowing many sputtered particles to reach the chucking layer forming region that the shielding member be disposed at a position closer to the substrate than the target. It is preferred in consideration of sputtered particles pass around a shielding member that the shielding mask have an opening formed so as to have a smaller area than an actual forming region.

The method for depositing a chucking layer on the entire surface of a substrate, followed by removing a portion of the deposited chucking layer, is one wherein a non-conduction portion is formed by first depositing a chucking layer as a film on a substrate surface, as commonly done, without taking any particular measure, such as provision of a shielding member on the substrate (with a result that the film necessarily wraps around a lateral surface and a rear surface of the substrate), followed by removing a portion of the film throughout the entire periphery of the substrate by grinding or the like. Examples of the method for removing a portion of the film include chemical etching, sandblasting using $Al_2O_3$ or the like, blasting using an aerosol of $CO_2$, Ar or $H_2O$, and mechanical grinding. The removed portion of the film may be located on a lateral surface of the substrate, or a corner (chamfered portion) of the substrate or on a rear surface of the substrate.

It is acceptable to adopt a method wherein a chucking layer is formed so as to be smaller than a substrate as stated above, and a non-conducting portion is formed with a measure taken to prevent a reflective layer from being deposited on a covered portion by, e.g., covering a specific portion with a covering member, and then the reflective layer is deposited. It is also acceptable to adopt a method wherein a chucking layer is formed so as to be smaller than a substrate, and a reflective layer is deposited on a front surface of a substrate as usual, and then a portion of the reflective layer is removed to form a non-conducting portion. The method for depositing a reflective layer with a specific portion being covered with a mask is particularly preferred in terms of reliably avoiding electrical connection. Examples of the covering member include a photosensitive resist and a polyimide tape.

When a reflective layer is deposited with a specific portion being covered with a mask as stated above, it is not necessary to limit a chucking layer forming region to a narrow range since the reflective layer is reliably prevented from being deposited on that specific portion. Specifically, it is preferred that the chucking layer forming region be set inwardly by a distance of 1 mm or above, more preferably by a distance of 5 mm or above from an edge of the substrate. When the chucking layer forming region is set in such ranges, the reflective layer can be prevented from being electrically connected to the chucking layer, with a result that the substrate is fabricated with the occurrence of defects minimized.

(Second Mode)

In a second mode of the substrate with a reflective layer wherein the reflective layer is prevented from being electrically connected to a chucking layer, a reflective layer forming region is set so as to be smaller than the substrate. Specific examples of the second mode include a mode wherein the reflective layer is formed only on a central portion of a substrate without being formed on a peripheral portion close to an edge of the substrate, and a mode wherein a non-conducting portion, which prevents electrical connection, is formed on a substrate surface. In a case wherein a reflective layer forming region is set so as to have a small area, even when a chucking layer has wrapped around a lateral surface of a substrate, even on a front surface of the surface, both films can be prevented from being overlapped and from being electrically connected together since the reflective layer forming region is apart from the wraparound portion. It is preferred that the non-conducting portion be formed throughout the entire periphery of a substrate as shown in FIG. 9.

It is preferred that the region where the non-conducting portion is formed be set inwardly by a distance M of 1 mm or above, more preferably 5 mm or above, from an edge of the substrate 10 as shown in FIG. 9. It is preferred that when the non-conducting portion forming region is represented by the minimum value m in the width of this forming region (which means the narrowest width of the non-conducting portion in the entire periphery of the substrate in consideration of a case wherein the non-conducting portion does not have a uniform width), the non-conducting portion forming region have a minimum width of preferably 1 mm or above, more preferably 5 mm or above, further preferably 100 mm or below. When the non-conducting layer forming region is set in such ranges, the reflective layer can be prevented from being electrically connected to the chucking layer, with a result that the substrate is fabricated with the occurrence of defects minimized. The non-conducting portion is not limited to be formed on an edge of the substrate.

Although the reflective layer is not limited to be formed in a circular shape (shown in FIG. 9($a$), an oval shape or a polygonal shape, such as a triangular shape or a square shape (shown in FIG. 9($b$)), it is preferred in consideration of an area capable of being subjected to exposure after fabrication as a mask that the reflective layer be formed in a square shape.

Examples of the method wherein the non-conducting portion is formed by making the reflective layer smaller than the substrate as stated above include (1) a method for depositing a reflective layer on a substrate while using a shielding member, such as a shielding mask, and (2) a method for depositing a reflective layer on the entire surface of a substrate, followed by removing a portion of the deposited reflective layer.

The method for depositing a reflective layer while using a shielding member is one wherein a shielding member is disposed between a substrate and a target in a film deposition chamber to prevent sputtered particles from reaching a lateral surface and a rear surface of the substrate in order to physically prevent a film from being deposited on the lateral surface and the rear surface. The shielding member may comprise a shielding mask, which is processed so as to conform to the shape of the reflective layer at the time of deposition, or a baffle, which shuts down a passage for film deposition. It is preferred from the viewpoint of allowing many sputtered particles to reach a reflective film forming region that the shielding member be disposed at a position closer to the substrate than the target.

The method for depositing a reflective layer on the entire surface of a substrate, followed by removing a portion of the deposited reflective layer, is one wherein a non-conduction portion is formed by first depositing as a reflective film as film on a substrate surface, as commonly done, without taking any particular measure, such as provision of a shielding member, followed by removing a portion of the deposited film by some kind of treatment. Examples of the method for removing a portion of the film include chemical etching, blasting using an aerosol, sandblasting, and mechanical grinding. The removed portion of the film may be located on a peripheral portion of the substrate, a lateral surface of the substrate, or a corner (chamfered portion) of the substrate or on a rear surface of the substrate. It is preferred in terms of avoiding the occurrence of electrical connection that the reflective layer as a film be removed throughout the entire periphery of the substrate.

(Third Mode)

Figure 10A:
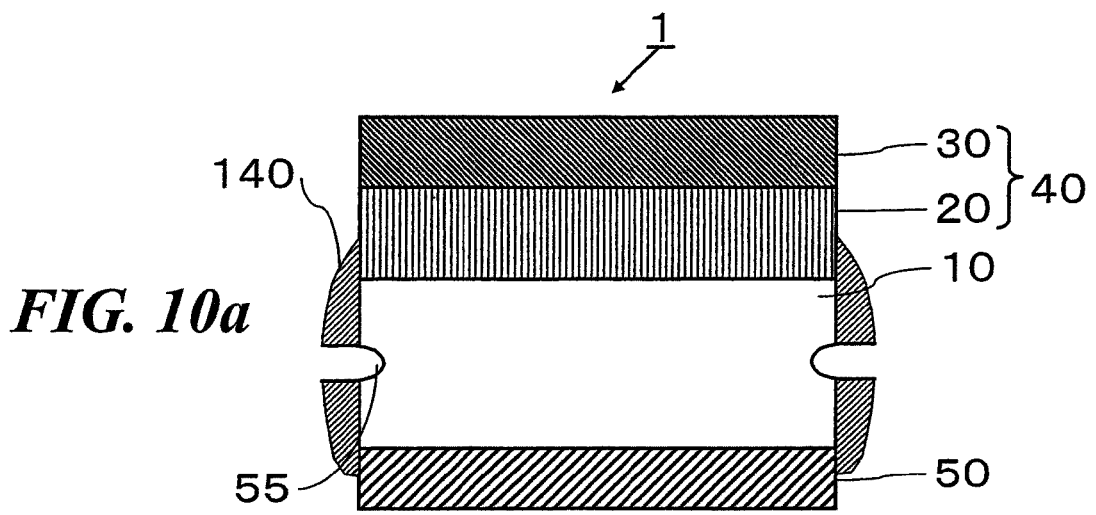
FIG. 10 is schematic vertical cross-sectional views of EUV mask blanks with deleted portions formed on a lateral surface in FIG. 10(a), a rear surface in FIG. 10(b) and a front surface in FIG. 10(c) on a substrate.
Figure 10B:
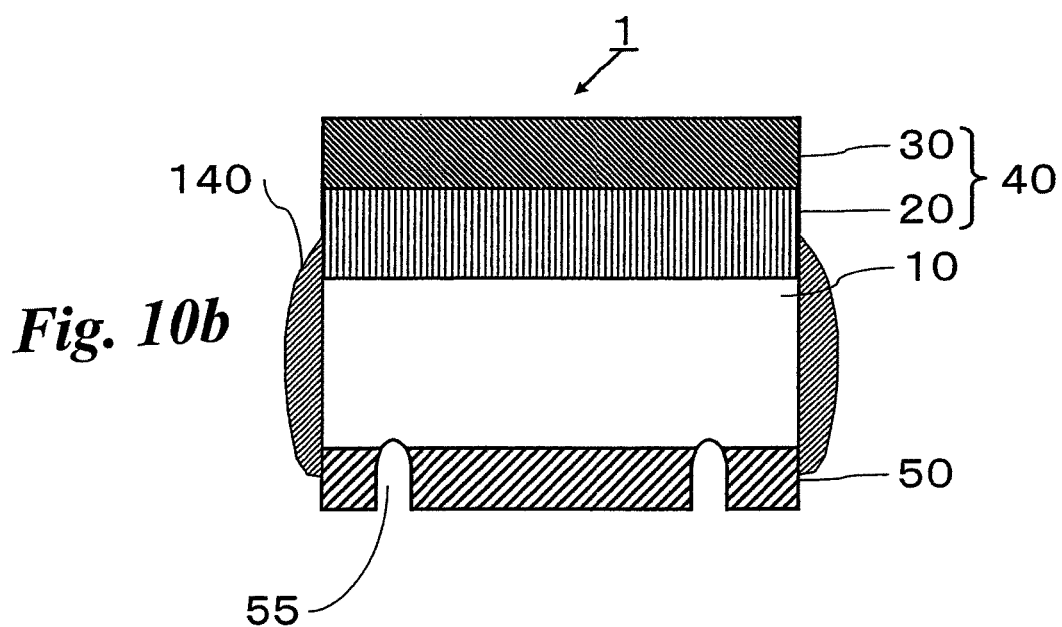
Figure 10C:
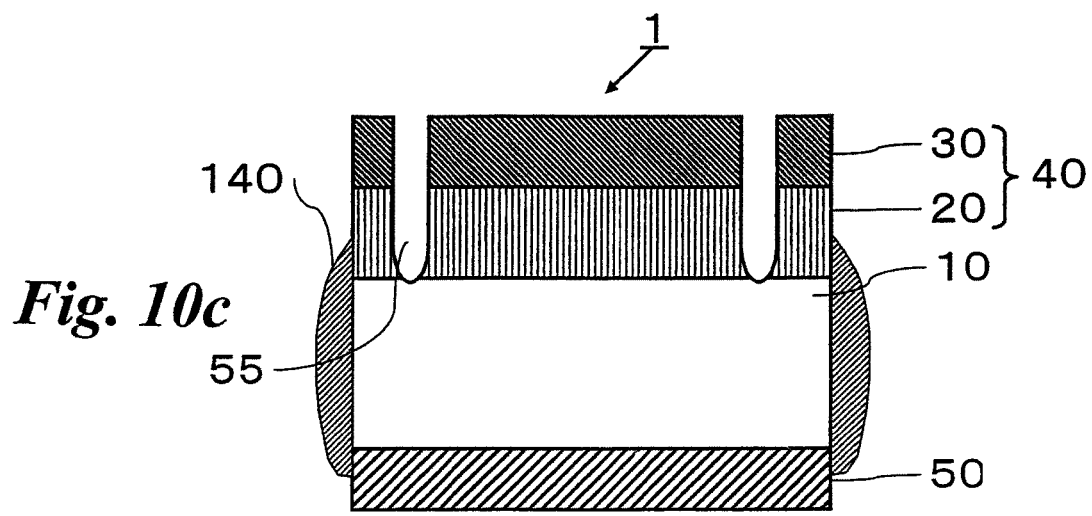

In a third mode of the substrate with a reflective layer wherein the reflective layer is prevented from being electrically connected to a chucking layer, a removed portion 55 is formed in at least one portion of a film on at least one of a lateral surface, a rear surface and a front surface of a substrate throughout the entire periphery of the substrate in order to form a non-conducting portion having no film (a chucking layer, a reflective layer or an absorbing layer) capable of causing electrical connection. A typical example wherein the removed portion is formed in a lateral surface of a substrate is shown in FIG. 10(*a*) as a cross-sectional view of an EUV mask blank. A typical example wherein the removed portion is formed in a rear surface of a substrate is shown in FIG. 10(*b*) as a cross-sectional view of an EUV mask blank. A typical example wherein the removed portion is formed in a front surface of a substrate is shown in FIG. 10(*c*) as a cross-sectional view of an EUV mask blank. This is because an edge of a film, which connects between a chucking layer 50 and a reflective layer 20, can be cut to eliminate the electrical connection by forming the removed portion 55. Even when an absorbing layer 30 is formed on a reflective layer 20, the electrical connection can be also eliminated by forming the removed portion 55. It should be noted that although the removed portion is shown to be formed at two locations in FIG. 10, it means that the removed portion is formed throughout the entire periphery of the substrate.

When the removed portion is formed in order to form a non-conducting portion in a lateral surface of a substrate, there is no limitation to where to form the removed portion. However, it is preferred from the viewpoint of easy grinding that the removed portion be formed in a central portion of the lateral surface in a width direction of the substrate as shown in FIG. 10(*a*). When the removed portion is formed in a rear surface of a substrate, the removed portion is formed in a peripheral portion close to an edge of the substrate as shown in FIG. 10(*b*). However, when electrostatic chucking is possible, there is no limitation to where to form the removed portion as long as the removed portion has a proper width. When the removed portion is formed in a front surface of a substrate, it is preferred in consideration of exposure area that the removed portion be formed in a peripheral portion close to an edge of the substrate as shown in FIG. 10(*c*).

The removed portion 55 has a width of preferably from 0.0001 to 1 mm, particularly from 0.001 to 0.5 mm in terms of elimination of electrical connection. The removed portion 55 has a depth without containing a film thickness (a depth obtained by engraving a film to a substrate and further engraving the substrate), of preferably from 0.0001 to 5 mm, particularly from 0.001 to 1 mm in terms of being capable of eliminating electrical connection to a desired degree.

It is preferred that the removed portion, which forms the non-conducting portion as stated above, be formed by (1) a method for forming a chucking layer and a reflective layer on a substrate, followed by removing the films from a lateral surface, a rear surface or a front surface of the substrate, or (2) a method for forming a chucking layer and then removing the film from a lateral surface or a rear surface of a substrate, followed by forming a reflective layer. When the reflective layer is formed by the method in item (2), it is preferred from the viewpoint of the reflective layer wrapping around the lateral surface of the substrate to possibly cause electrical connection again that the reflective layer be formed only on a central portion of the substrate without being formed on a peripheral portion close to an edge of the substrate. It is preferred that the position where the reflective layer is formed be set so as to be apart from an edge of the substrate by a distance M of 1 mm or above, particularly 5 mm or above as shown in FIG. 9.

Examples of the method for removing a film include chemical etching, blasting using an aerosol, sandblasting, and mechanical grinding. The removed portion of the film may be formed in one surface, two surfaces or all three surfaces among a front surface, a lateral surface and a rear surface of a substrate, or so as to bridge a plurality of surfaces. The removed portion may be formed at not only a single location but also plural locations.

(Fourth Mode)

Figure 11:
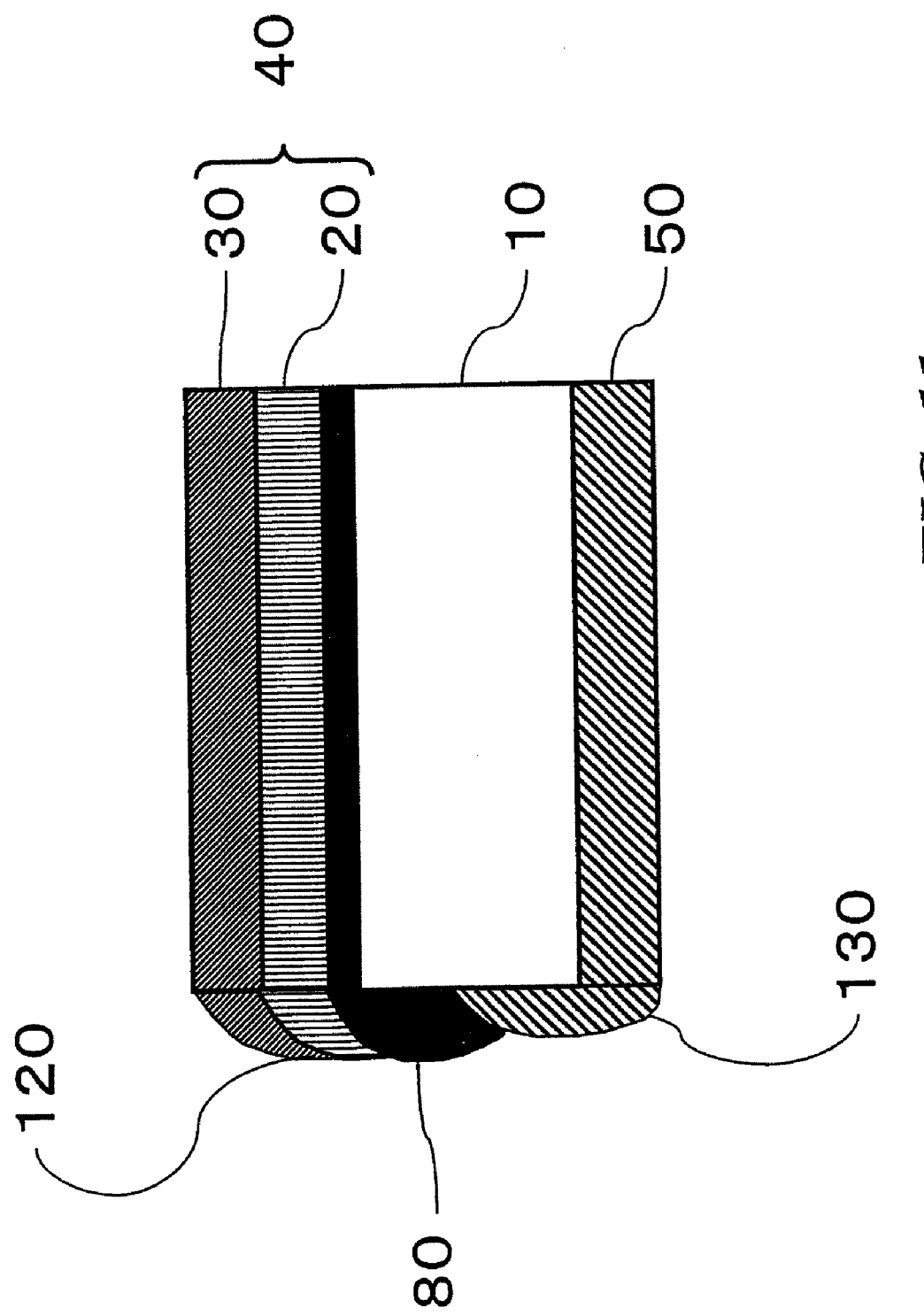
FIG. 11 is a schematic vertical cross-sectional view of an EUV mask blank with an insulating film formed between a substrate and a laminated film.

In a fourth mode of the substrate with a reflective layer which has no electrical connection between the reflective layer and a chucking layer, a specific insulating layer is formed between a substrate and the reflective layer to form a non-conducting portion. FIG. 11 shows a mode wherein a substrate 10 has a chucking layer 50 formed on a rear surface thereof, and the substrate 10 has a reflective layer 20 and an absorbing layer 30 formed on a front surface thereof through an insulating layer 80. It is possible to prevent electrical connection from being caused since the formation of the insulating layer 80 can cut the film edges of the conductive film 50 and the reflective layer 20, which otherwise cause electrical connection therebetween. Even when the absorbing layer 30 is formed on the reflective layer 20 as shown in FIG. 11, it is also possible to eliminate electrical connection by the formation of the insulating layer 80.

There is no limitation to the material for the insulating layer as long as the insulating layer comprises a commonly used insulating material. Examples of the material include various kinds of oxides, such as $SiO_2$, $Al_2O_3$, $Ta_2O_5$ or $HfO_2$. It is preferred in terms of being required to have such degree of thickness to be capable of eliminating electrical connection that the insulating layer have a thickness of from 5 to 1,000 nm, particularly from 50 to 300 nm. The insulating film means a film having a volume resistivity of $10^{12}$ Ω·cm or above, which may be measured according to ASTM-D257. It is preferred in terms of being capable of eliminating electrical connection that the insulating film have a surface resistivity of $10^{10}$ Ω/square or above.

An example of the method wherein the substrate with a reflective layer is fabricated so as to have an insulating layer interposed stated above is one wherein a chucking layer is first formed on a rear surface of a substrate, and then an insulting layer is formed in at least a region to form a reflective layer, followed by forming the reflective layer in the same region as or a smaller region than the insulating film. As the method for forming the insulating layer, it is acceptable to use the same method as the method for forming a chucking layer, such as a sputtering method.

It is preferred in terms of preventing electrical connection from being caused that even a substrate with an insulating layer, which has only a chucking layer and an insulating layer for an EUV mask blank, have no electrical connection between the insulating layer and the chucking layer. No electrical connection means that the resistance value between the reflective layer and the chucking layer is 1 MΩ or above, is preferably 5 MΩ or above, is more preferably 10 MΩ or above, is further preferably set at such a high level that is impossible to measure. The resistance value between the reflective layer and the chucking layer may be represented by a resistance value, which is measured, by a two-point probe method or a four-point probe method, between two points of a point in an region corresponding to an exposure region (normally a square region of 104×132 mm in a central portion of the substrate) and a point in an region of a film formed on the rear surface of the substrate to be used for electrostatic chucking by an electrostatic chuck.

The first to the fourth modes stated above may be adopted, being combined. For example, the substrate with a reflective layer may be configured so as to include an insulating layer as in the fourth mode and also include a removed portion as in the third mode. A combination of modes is preferred since electrical connection between both films can be reliably eliminated.

Although the first to the fourth modes stated above are mainly directed to a substrate with a reflective layer, which has a chucking layer and a reflective layer formed thereon, these modes are also applicable to a substrate with an absorbing layer (an EUV mask blank), which has a chucking layer, a reflective layer and an absorbing layer formed thereon (wherein it is also acceptable to have an intermediate layer or a low-reflective layer stated later as required). In the latter case, the same modes and the same methods as the former case are applicable. It is preferred in terms of being capable of effectively expanding an exposure area of a mask that the reflective layer, the intermediate layer and the absorbing layer be deposited in the same shape.

Now, the EUV mask blank according to the present invention will be described. FIG. 1 is a schematic view of the EUV mask blank 1 according to the present invention. In FIG. 1, the substrate 10 has the reflective layer 20 and the absorbing layer 30 formed thereon. The substrate has the chucking layer 50 formed on the rear surface thereof. The EUV mask blank is characterized in that the chucking layer 50 has no electrical connection to a laminated film 40 comprising the reflective layer 20 and the absorbing layer 30. The reflective layer 20 and the absorbing layer 30 may have an intermediate layer (not shown) formed therebetween. The absorbing layer may have a low-reflective layer (not shown) formed on a surface thereof remote from the substrate (an upper surface) in terms of low reflectivity with respect of inspection light. A preferred example of the low-reflective layer is a layer that is prepared by oxidizing a portion of the absorbing layer.

As the composition and the fabrication method for each of the substrate, the chucking layer and the reflective layer for the EUV mask blank according to the present invention, it is acceptable to use the same composition and the same fabrication method as the substrate with a reflective layer. For example, with regard to (1) the material and the flatness of the substrate, (2) the composition, the forming method, the characteristics and the film thickness of the reflective layer, (3) the composition, the forming method, the characteristics and the film thickness of the capping layer, and (4) the composition, the forming method, the characteristics and the film thickness of the absorbing layer, it is acceptable to rely on the information on these items in connection with the substrate with a reflective layer as they are.

The EUV mask blank according to the present invention may be obtained by fixing a substrate with a reflective layer by an electrostatic chuck (or disposing a reflective layer on a substrate in a film deposition chamber and keeping the substrate put in the film deposition chamber as it is), followed by depositing an absorbing layer by a sputtering method, such as a magnetron sputtering method or an ion beam sputtering method.

In the EUV mask blank according to the present invention, the absorbing layer, which is deposited on the reflective layer, may comprise a material having a high absorption coefficient with respect to EUV light, specifically, e.g., Cr, Ta or a nitride thereof, a boride and a boron nitride. Among them, TaN is most preferable because of being amorphous and having a smooth surface. It is preferred that the absorbing layer have a thickness of from 50 to 100 nm. There is no limitation to the method for depositing the absorbing layer, as long as a sputtering method is used. Either one of a magnetron supporting method or an ion beam sputtering method is acceptable.

When a TaN layer is deposited as the absorbing layer by an ion beam sputtering method, it is preferred that film deposition be performed so as to have a thickness of from 50 to 100 nm at a deposition rate of 0.01 to 0.1 nm/sec, using a Ta target as the target, using a $N_2$ gas (having a gas pressure of from $1.3 \times 10^{-2}$ Pa to $2.7 \times 10^{-2}$ Pa) and applying a voltage of from 300 to 1500 V.

When the absorbing layer 30 is deposited by a sputtering method, in order to obtain a film thickness having a uniform surface distribution, it is preferred to perform film deposition, rotating a rotor with the substrate being chucked and supported thereon.

In the EUV mask blank according to the present invention, the reflective layer (a capping layer, when the capping layer is formed on a multilayer film) and the absorbing layer may have an intermediate layer interposed therebetween. The intermediate layer serves as an etching stopper layer when etching the EUV mask blank.

The intermediate layer may comprise Cr, Al, Ru, Ta or a nitride thereof, $SiO_2$, $Si_3N_4$, $Al_2O_3$ for example. It is preferred that the intermediate layer have a thickness of from 10 to 60 nm.

There is no limitation to the method for depositing the intermediate layer, as long as a sputtering method is used. Either one of a magnetron supporting method or an ion beam sputtering method is acceptable.

The EUV mask blank according to the present invention is characterized in that the chucking layer 50 has no electrical connection to the laminated film 40 comprising the reflective layer 20 and the absorbing layer 30.

In a case of fabricating an EUV mask blank, when film deposition is performed, without taking any particular measure, by a sputtering method, not only a film of the reflective layer but also a film of the absorbing layer wraps around a lateral surface of a substrate and even a rear surface of the substrate in some cases as in the substrate with a reflective layer. Although FIG. 1 of Patent Document 1 shows that an EUV mask blank as shown in FIG. 2 of the present application is fabricated, it is supposed that the actually fabricated EUV mask blank is configured to have a wraparound portion 120 formed as shown in FIG. 3.

It is supposed that the chucking layer also forms the wraparound portion 130 as stated above and as shown in FIG. 5, with a result that the overlapping portion 140 as shown in FIG. 6 is formed on the EUV mask blank as well. Although Patent Documents 1 and 2 are silent on the formation of the wraparound portions 120 and 130, these portions are necessarily formed when using a normal sputtering method without taking any particular measure.

By formation of such overlapping portions, the same problem as the one stated about the substrate with a reflective layer is caused in the EUV mask blank as well. When the EUV mask blank is configured to have no electrical connection between the chucking layer and the laminated film comprising the reflective layer and the absorbing layer in consideration of this problem, it is possible to prevent a film formed on a substrate surface from being electrically charged and to prevent particles from being attracted to the substrate by a Coulomb force, with a result that the EUV mask blank and the EUV mask can be fabricated with the occurrence of defects minimized.

It should be noted that no electrical connection means that the resistance value between the laminated film and the chucking layer is 1 M$\Omega$ or above, is preferably 5 M$\Omega$ or above, is more preferably 10 M$\Omega$ or above, is further preferably set at such a high level that is impossible to measure. The resistance value between the reflective layer and the chucking layer may be represented by a resistance value, which is measured, by a two-point probe method or a four-point probe method, between two points of a point in an region corresponding to an exposure region (normally a square region of 104×132 mm in a central portion of the substrate) and a point in an region of a film formed on the rear surface of the substrate to be used for electrostatic chucking by an electrostatic chuck.

It is preferred that the overlapping portion 140 is as small as possible. It is particularly preferred that no overlapping portion 140 is formed. In a case wherein the insulating film is formed, even when the overlapping portion 140 is formed, no problem is caused since the formation of the insulating film can eliminate electrical connection.

The EUV mask blank having no electrical connection between the laminated film and the chucking layer may be fabricated in one of the following modes. These modes are substantially the same as the first to the fourth modes of the substrate with a reflective layer.

Examples of a first mode include a mode wherein the chucking layer is formed so as to be smaller than the substrate, specifically the chucking layer is formed only on a central portion without being formed on a peripheral portion close to the substrate edge, and a mode wherein the non-conducting portion is formed between the substrate edge and the chucking layer forming region so as to eliminate electrical connection. In a case wherein the chucking layer forming region is set so as to have a small area, even when the chucking layer has wrapped around, both films can be prevented from being overlapped and from being electrically connected together since the reflective layer forming region is apart from the wraparound portion. For this reason, it is preferred that the non-conducting portion be formed throughout the entire periphery of the substrate. With respect to the dimensions of the chucking layer forming region or the like, explanation of the above-mentioned substrate with a reflective layer is applicable.

Examples of the method for fabricating the above-mentioned EUV mask blank having no electrical connection include (1) a method for depositing a chucking layer on a substrate while using a shielding member, such as a shielding mask, and (2) a method for depositing a chucking layer on the entire surface of a substrate, followed by removing a portion of the deposited chucking layer. With respect to the material and the dimensions of the shielding mask, the grinding method or the like, explanation of the above-mentioned substrate with a reflective layer is applicable.

Examples of a second mode include a mode wherein the region where the laminated film having a laminated structure comprising the reflective layer and the absorbing layer is formed so as to be smaller than the substrate, specifically the laminated film is formed only on a central portion of the substrate without being formed on a peripheral portion close to the substrate edge, and a mode wherein the non-conducting portion is formed in a substrate surface so as to eliminate electrical connection. In a case wherein a forming region is set so as to have a small area, even when the chucking layer has wrapped around so as to cover a portion of a lateral surface of the substrate, even on a rear surface of the surface in some cases, no electrical connection is caused since the laminated film is apart from the wraparound portion. For this reason, it is preferred that the non-conducting portion be formed throughout the entire periphery of the substrate. With respect to the position where the laminated film should be formed and the method for forming the laminated film, explanation of the above-mentioned substrate with a reflective layer is applicable.

Examples of the method for fabricating the above-mentioned EUV mask blank having no electrical connection include (1) a method for depositing the laminated layer on a substrate while using a shielding member, such as a shielding mask, and (2) a method for depositing the laminated layer on the entire surface of a substrate, followed by removing a portion of the substrate. With respect to the material and the dimensions of the shielding mask, the grinding method or the like, explanation of the above-mentioned substrate with a reflective layer is applicable.

In a third mode, a film has a removed portion formed in at least one portion of the depth direction thereof on at least one of a lateral surface, a rear surface and a front surface of a substrate throughout the entire periphery of the substrate in order to form a non-conducting portion having no film (the chucking layer and the laminated film) capable of causing electrical connection. This is because an edge of a film, which electrically connects between the chucking layer and the laminated film, can be cut to eliminate the electrical connection by forming the removed portion. With respect to the depth, the width or another factor of the removed portion, explanation of the above-mentioned substrate with a reflective layer is applicable.

It is also acceptable to adopt a method for preliminarily forming a notch in a substrate throughout the entire periphery thereof and removing an overlapping portion formed in the notch. Examples of the method for removing the overlapping portion include chemical etching, blasting using an aerosol, sandblasting, and mechanical grinding.

Examples of the method for fabricating the above-mentioned EUV mask blank having no electrical connection include (1) a method for forming a chucking layer and a laminated film on a substrate, followed by removing a portion of the films from at least one of a lateral surface, a rear surface and a front surface of the substrate, or (2) a method for forming a chucking layer on a substrate and then removing a portion of the film from at least one of a lateral surface, a rear surface and a front surface of the substrate, followed by forming a laminated film. With respect to the method for removing a portion of a film or the like, explanation of the above-mentioned substrate with a reflective layer is applicable.

In a fourth mode, a specific insulating layer is formed between a substrate and a laminated film. It is possible to prevent electrical connection from being caused since the formation of the insulating film can cut an edge of the film that has caused electrical connection between the insulating layer and the laminated film. With respect to the composition, the forming method and the film thickness of the insulating layer, explanation of the above-mentioned substrate with a reflective layer is applicable.

The present invention can provide a substrate with a reflective layer, which has no electrical connection between the above-mentioned reflective layer and the above-mentioned chucking layer, and a substrate with a chucking layer, which is applicable to an EUV mask blank having no electrical connection between the above-mentioned reflective layer and the above-mentioned chucking layer, and between the above-mentioned absorbing layer and the above-mentioned chucking layer. Specifically, the above-mentioned substrate with a chucking layer has the same laminated structure as the first mode, the third mode and the fourth mode, which have been state above. The above-mentioned substrate with a chucking layer may be fabricated by using the same method as the first mode, the third mode and the fourth mode.

In accordance with the present invention, it is possible to fabricate an EUV mask with the occurrence of defects minimized, by patterning an EUV mask blank with the occurrence of defects minimized. It is possible to realize effective exposure by using such an EUV mask with the occurrence of defects minimized.

The substrate with a reflective layer according the present invention can prevent the generation of particles to consequently minimize the occurrence of defects since electrical connection between the chucking layer and the reflective layer can be eliminated to prevent some particles from being attracted to the substrate, which is negatively (or positively) charged. The EUV mask blank according the present invention can prevent the generation of particles to consequently minimize the occurrence of defects since electrical connection between the chucking layer and the laminated film can be eliminated to prevent some particles from being attracted to the substrate, which is negatively (or positively) charged.

The substrate with a reflective layer according the present invention is particularly effective to be used as a mask for exposure using EUV light because of being capable of fabricating an EUV mask blank with the occurrence of defects minimized.

What is claimed is:

1. A reflective mask blank for EUV lithography, comprising:
   a substrate having a front surface and a rear surface;
   a reflective layer formed over the front surface of the substrate;
   an absorbing layer formed over the reflective layer; and
   a chucking layer formed on the rear surface of the substrate and positioned to chuck the substrate to an electrostatic chuck,
   wherein the substrate has a non-conducting portion which eliminates electrical conduction between the reflective layer and the chucking layer and electrical conduction between the absorbing layer and the chucking layer, and the non-conducting portion is formed by forming a portion of the substrate covered with at least one covering member and preventing formation of the reflective layer and the absorbing layer such that the non-conducting portion provides the resistance value of 1 MΩ or above between the reflective layer and the chucking layer and the resistance value of 1 MΩ or above between the absorbing layer and the chucking layer.

2. The reflective mask blank according to claim 1, wherein the resistance value between the reflective layer and the chucking layer and the resistance value between the absorbing layer and the chucking layer are 5 MΩ or above.

3. The reflective mask blank according to claim 1, wherein the non-conducting portion is formed on the rear surface and positioned in a region beginning from edges of the substrate and extending in a width of 2 mm or above measured from the edges.

4. The reflective mask blank according to claim 1, wherein the chucking layer is formed in a region which has a smaller area than a contact area of the electrostatic chuck with the substrate, when the substrate is supported by the electrostatic chuck.

5. The reflective mask blank according to claim 1, wherein the non-conducting portion is formed on the front surface of the substrate.

6. The reflective mask blank according to claim 5, wherein the non-conducting portion is formed from edges of the substrate and extends in a width of 1 mm or above measured from the edges.

7. The reflective mask blank according to claim 1, wherein the reflective layer and the absorbing layer are formed in a square shape.

8. The reflective mask blank according to claim 1, wherein the non-conducting portion is formed on a lateral surface of the substrate.

9. A reflective mask for EUV lithography, fabricated by patterning the reflective mask blank defined in claim 1.

10. The reflective mask blank according to claim 1, wherein the substrate comprises $SiO_2$—$TiO_2$ glass, and the $SiO_2$—$TiO_2$ glass has one of a hydrogen molecule content of less than $5 \times 10^{17}$ molecules/$cm^3$ and an OH group content of 600 wt.ppm or below.

11. The reflective mask blank according to claim 1, further comprising a low-reflective layer on the absorbing layer, wherein the non-conductive portion eliminates electrical conduction between the low-reflective layer and the chucking layer.

12. The reflective mask blank according to claim 1, wherein the reflective layer is formed by depositing Si films and Mo films in from 30 to 50 cycles, and the reflective layer has a total thickness of from 200 to 400 nm.

13. The reflective mask blank according to claim 1, wherein the reflective layer has a capping layer formed as a top layer thereof.

14. The reflective mask blank according to claim 1, wherein the chucking layer comprises at least one metal material selected from the group consisting of Cr, Ni, Ti, Ta, Mo, Si and W.

15. The reflective mask blank according to claim 1, wherein the absorbing layer comprises Cr, Ta or a nitride thereof.

16. The reflective mask blank according to claim 1, further comprising an intermediate layer interposed between the reflective layer and the absorbing layer, wherein the non-conductive portion eliminates electrical conduction between the intermediate layer and the chucking layer.

17. The reflective mask blank according to claim 1, wherein the reflective layer includes a capping layer which prevents a surface of the reflective layer from being oxidized.

18. A method for manufacturing a reflective mask blank for EUV lithography, comprising:
providing a substrate having a front surface and a rear surface;
covering a portion of the substrate with a first covering member which prevents formation of a reflective layer;
forming a reflective layer over the front surface of the substrate such that the portion covered with the first covering member forms a non-conducting portion which provides the resistance value of 1 MΩ or above between the reflective layer and a chucking layer;
forming an absorbing layer over the reflective layer such that the non-conducting portion provides the resistance value of 1 MΩ or above between the absorbing layer and the chucking layer by forming the portion covered with at least one of the first covering member and a second covering member and preventing formation of the absorbing layer; and
forming the chucking layer on the rear surface of the substrate such that the chucking layer is positioned to chuck the substrate to an electrostatic chuck.

19. The method for manufacturing a reflective mask blank for EUV lithography according to claim 18, wherein the forming of the reflective layer comprises forming a reflective layer including a capping layer which prevents a surface of the reflective layer from being oxidized.

20. The method for manufacturing a reflective mask blank for EUV lithography according to claim 18, further comprising forming an intermediate layer on the reflective layer, wherein the non-conductive portion eliminates electrical conduction between the intermediate layer and the chucking layer.

21. The method for manufacturing a reflective mask blank for EUV lithography according to claim 18, further comprising forming a low-reflective layer on the absorbing layer, wherein the non-conductive portion eliminates electrical conduction between the low-reflective layer and the chucking layer.

22. The method for manufacturing a reflective mask blank for EUV lithography according to claim 18, wherein the forming of the chucking layer is carried out after the forming of the reflective layer.

23. The method for manufacturing a reflective mask blank for EUV lithography according to claim 18, wherein the covering comprises covering the portion of the substrate with the first covering member comprising one of a photosensitive resist and a polyimide tape.

24. The method for manufacturing a reflective mask blank for EUV lithography according to claim 18, wherein the forming of the chucking layer is carried out before the forming of the reflective layer.

* * * * *